(12) United States Patent
Shimizu

(10) Patent No.: US 11,362,174 B2
(45) Date of Patent: Jun. 14, 2022

(54) METHOD OF MANUFACTURING SEMICONDUCTOR DEVICE AND SEMICONDUCTOR DEVICE

(71) Applicant: KABUSHIKI KAISHA TOSHIBA, Minato-ku (JP)

(72) Inventor: Tatsuo Shimizu, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 155 days.

(21) Appl. No.: 16/992,335

(22) Filed: Aug. 13, 2020

(65) Prior Publication Data

US 2021/0118984 A1    Apr. 22, 2021

(30) Foreign Application Priority Data

Oct. 17, 2019 (JP) .............................. JP2019-190351

(51) Int. Cl.
*H01L 29/06* (2006.01)
*H01L 21/265* (2006.01)
(Continued)

(52) U.S. Cl.
CPC ........ *H01L 29/063* (2013.01); *H01L 21/0214* (2013.01); *H01L 21/0217* (2013.01);
(Continued)

(58) Field of Classification Search
CPC .............. H01L 29/063; H01L 21/0214; H01L 21/02164; H01L 21/0217; H01L 21/02178; H01L 21/26546; H01L 21/28264; H01L 21/3245; H01L 29/2003; H01L 29/205; H01L 29/4236; H01L 29/66462; H01L 29/7786; H01L 21/2656; H01L 21/3228; H01L 29/0607; H01L 29/0847; H01L 29/207; H01L 29/42376; H01L 29/7789
(Continued)

(56) References Cited

U.S. PATENT DOCUMENTS

2016/0308040 A1* 10/2016 Chu .................... H01L 21/0262

FOREIGN PATENT DOCUMENTS

| JP | 2008-235740 A | 10/2008 |
| JP | 2008235740 A | * 10/2008 |
| JP | 2017-212407 A | 11/2017 |

* cited by examiner

*Primary Examiner* — Tong-Ho Kim
(74) *Attorney, Agent, or Firm* — Oblon, McClelland, Maier & Neustadt, L.L.P.

(57) ABSTRACT

A method of manufacturing semiconductor device of an embodiment includes performing a first ion implantation implanting at least one element selected from a group consisting of beryllium (Be), magnesium (Mg), calcium (Ca), strontium (Sr), barium (Ba), zinc (Zn), cadmium (Cd), silicon (Si), germanium (Ge), and tin (Sn) into a nitride semiconductor layer; performing a second ion implantation implanting nitrogen (N) into the nitride semiconductor layer; performing a third ion implantation implanting hydrogen (H) into the nitride semiconductor layer; forming a covering layer on a surface of the nitride semiconductor layer after the first ion implantation, the second ion implantation, and the third ion implantation; performing a first heat treatment after forming the covering layer; removing the covering layer after the first heat treatment; and performing a second heat treatment after removing the covering layer.

20 Claims, 28 Drawing Sheets

(51) Int. Cl.
*H01L 21/28* (2006.01)
*H01L 21/324* (2006.01)
*H01L 29/20* (2006.01)
*H01L 29/205* (2006.01)
*H01L 29/423* (2006.01)
*H01L 29/66* (2006.01)
*H01L 29/778* (2006.01)
*H01L 21/02* (2006.01)

(52) U.S. Cl.
CPC .. *H01L 21/02164* (2013.01); *H01L 21/02178* (2013.01); *H01L 21/26546* (2013.01); *H01L 21/28264* (2013.01); *H01L 21/3245* (2013.01); *H01L 29/2003* (2013.01); *H01L 29/205* (2013.01); *H01L 29/4236* (2013.01); *H01L 29/66462* (2013.01); *H01L 29/7786* (2013.01)

(58) Field of Classification Search
USPC .......................................................... 257/76
See application file for complete search history.

METHOD OF MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2019-190351, filed on Oct. 17, 2019, the entire contents of which are incorporated herein by reference.

FIELD

Embodiments described herein relate generally to a manufacturing method of semiconductor devices and a semiconductor device.

BACKGROUND

Semiconductor elements such as transistors and diodes are used for circuits such as switching power supply circuits and inverter circuits. These semiconductor elements are required to have high breakdown voltage and low on-resistance. Further, the relationship between the breakdown voltage and the on-resistance has a trade-off relationship determined by an element material.

Due to advances in technological development, in semiconductor elements, low on-resistance is achieved near the limit of silicon which is a main element material. In order to further improve the breakdown voltage and further reduce the on-resistance, it is necessary to change the element material. When a nitride semiconductor such as gallium nitride or aluminum gallium nitride is used as the element material of the semiconductor element, the trade-off relationship determined by the element material can be improved. Therefore, the semiconductor element can be dramatically increased in breakdown voltage and reduced in on-resistance.

In a case where the semiconductor element is formed by using the nitride semiconductor, desirably, a p-type impurity region or an n-type impurity region is formed locally at a desired position of the nitride semiconductor by an ion implantation method. When the p-type impurity region and the n-type impurity region are formed locally by using the ion implantation method, the semiconductor element can be easily improved in performance and reduced in cost.

DETAILED DESCRIPTION

Figure 1:
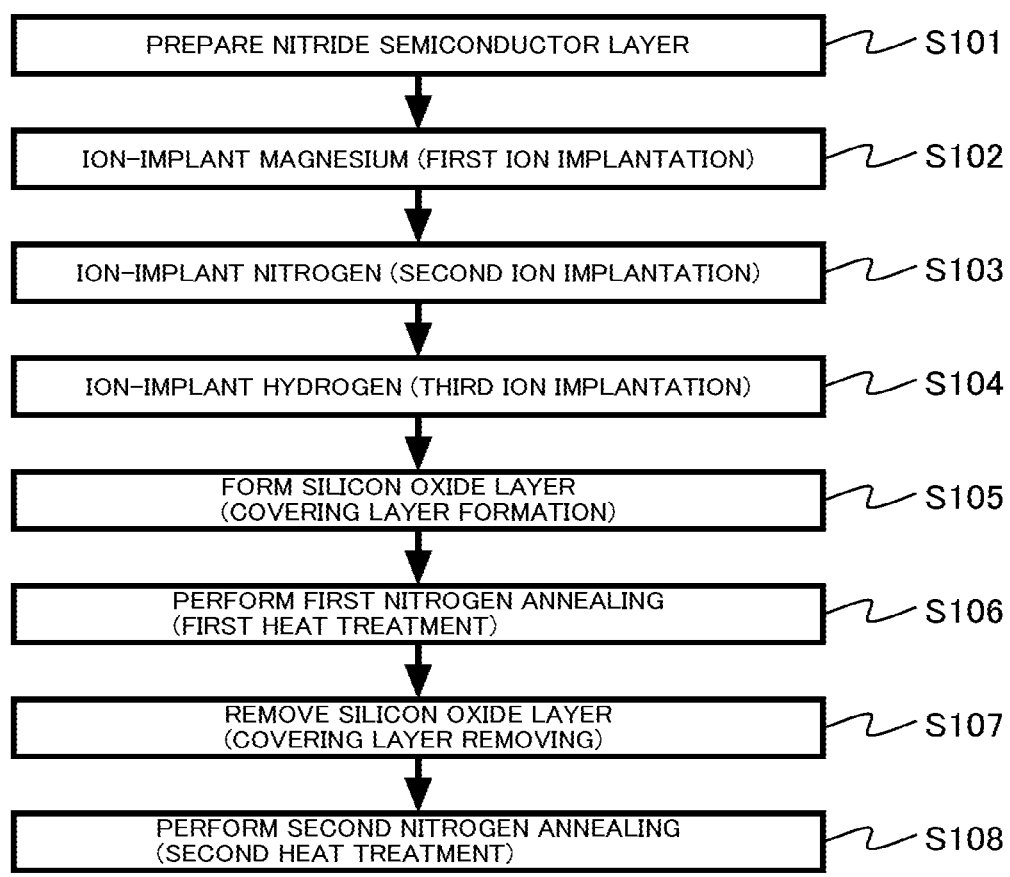
FIG. 1 is a diagram illustrating a manufacturing flow of a manufacturing method of semiconductor devices according to a first embodiment.

A manufacturing method of semiconductor devices according to an embodiment includes: performing a first ion implantation implanting at least one element selected from a group consisting of beryllium (Be), magnesium (Mg), calcium (Ca), strontium (Sr), barium (Ba), zinc (Zn), cadmium (Cd), silicon (Si), germanium (Ge), and tin (Sn) into a nitride semiconductor layer; performing a second ion implantation implanting nitrogen (N) into the nitride semiconductor layer; performing a third ion implantation implanting hydrogen (H) into the nitride semiconductor layer; forming a covering layer on a surface of the nitride semiconductor layer after the first ion implantation, the second ion implantation, and the third ion implantation; performing a first heat treatment after forming the covering layer; removing the covering layer after the first heat treatment; and performing a second heat treatment after removing the covering layer.

Hereinafter, embodiments of the present disclosure will be described with reference to the drawings. Incidentally, in the following description, the same or similar members are denoted by the same reference numerals, and description of members once described may be omitted.

In this specification, the "nitride semiconductor layer" includes a "GaN-based semiconductor". The "GaN-based semiconductor" is a general term for semiconductors having gallium nitride (GaN), aluminum nitride (AlN), indium nitride (InN), and an intermediate composition thereof.

In this specification, "undoped" means that the impurity concentration is $1 \times 10^{15}$ cm$^{-3}$ or less.

In this specification, in order to illustrate the positional relationship of parts and the like, the upper direction of the drawing is described as "up", and the lower direction of the drawing is described as "down". In this specification, the terms "up" and "down" are not necessarily terms indicating the relationship with the direction of gravity.

First Embodiment

A manufacturing method of semiconductor devices according to a first embodiment includes: performing a first ion implantation implanting at least one element selected from a group consisting of beryllium (Be), magnesium (Mg), calcium (Ca), strontium (Sr), barium (Ba), zinc (Zn), cadmium (Cd), silicon (Si), germanium (Ge), and tin (Sn) into a nitride semiconductor layer; performing a second ion implantation implanting nitrogen (N) into the nitride semiconductor layer; performing a third ion implantation implanting hydrogen (H) into the nitride semiconductor layer; forming a covering layer on a surface of the nitride semiconductor layer after the first ion implantation, the second ion implantation, and the third ion implantation; performing a first heat treatment after forming the covering layer; removing the covering layer after the first heat treatment; and performing a second heat treatment after removing the covering layer.

FIG. 1 is a diagram illustrating a manufacturing flow of the manufacturing method of semiconductor devices according to the first embodiment. The semiconductor device of the first embodiment is a nitride semiconductor layer having a p-type impurity region.

FIGS. 2, 3, 4, 5, 6, 7, 8, and 9 are cross-sectional views illustrating the manufacturing method of semiconductor devices according to the first embodiment.

The manufacturing method of semiconductor devices according to the first embodiment includes nitride semiconductor layer preparation step S101, magnesium ion implantation step S102 (first ion implantation), nitrogen ion implantation step S103 (second ion implantation), hydrogen ion implantation step S104 (third ion implantation), silicon oxide layer formation step S105 (covering layer formation), first nitrogen annealing step S106 (first heat treatment), silicon oxide layer removing step S107 (covering layer removing), and second nitrogen annealing step S108 (second heat treatment).

Figure 2:
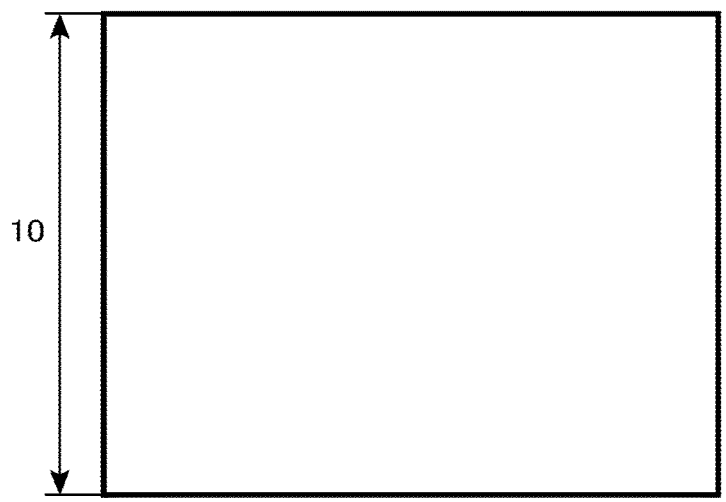
FIG. 2 is a schematic cross-sectional view illustrating the manufacturing method of semiconductor devices according to the first embodiment.

First, a nitride semiconductor layer 10 is prepared (S101: FIG. 2). The nitride semiconductor layer 10 is a GaN-based semiconductor. Hereinafter, a case where the nitride semiconductor layer 10 is gallium nitride (GaN) will be described as an example.

Figure 3:
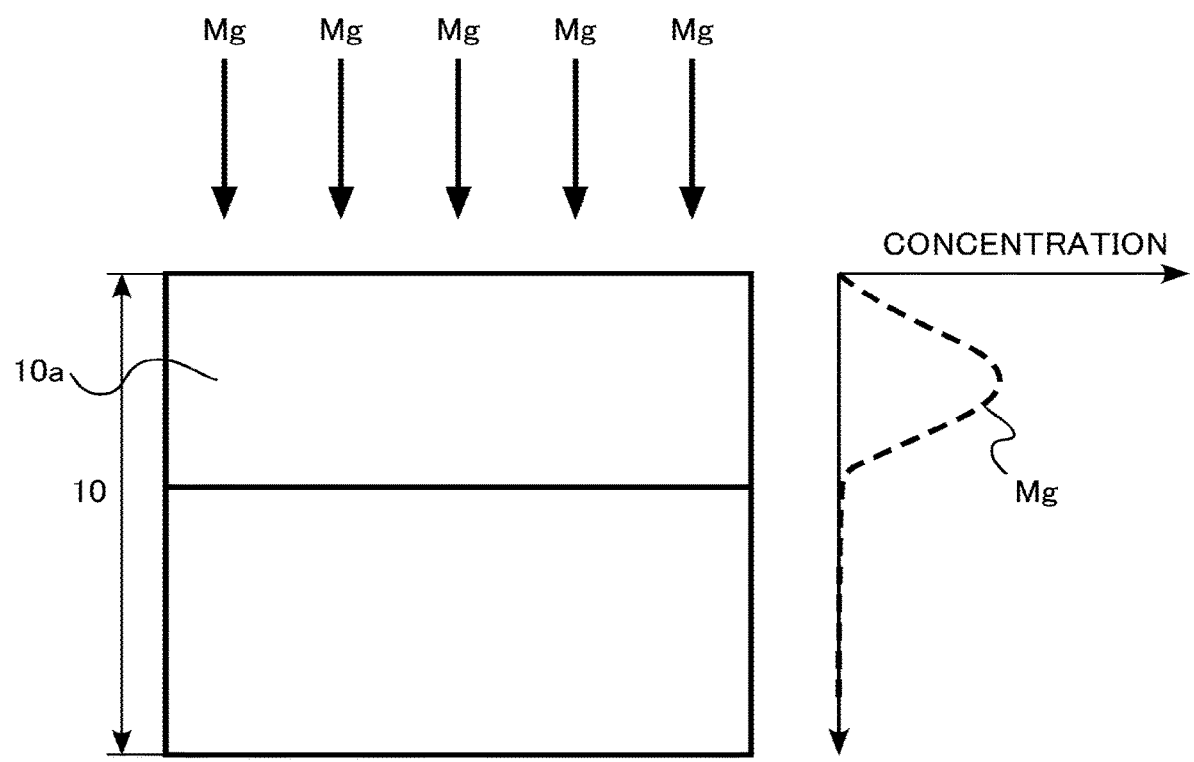
FIG. 3 is a schematic cross-sectional view illustrating the manufacturing method of semiconductor devices according to the first embodiment.

Next, magnesium (Mg) is ion-implanted into the surface of the nitride semiconductor layer 10 by using a known ion implantation method (S102: FIG. 3). The magnesium ion implantation corresponds to the first ion implantation. The element to be implanted by the first ion implantation is not limited to magnesium (Mg) and may be at least one element (conductive impurity) selected from the group consisting of beryllium (Be), magnesium (Mg), calcium (Ca), strontium (Sr), barium (Ba), zinc (Zn), cadmium (Cd), silicon (Si), germanium (Ge), and tin (Sn).

An impurity region 10a is formed in the nitride semiconductor layer 10 by ion-implanting magnesium. For example, magnesium may be ion-implanted multiple times with different ion-implantation energies.

The dose amount of magnesium is, for example, equal to or more than $1 \times 10^{11}$ cm$^{-2}$ and equal to or less than $1 \times 10^{15}$ cm$^{-2}$. FIG. 3 also illustrates the concentration distribution of magnesium in the semiconductor layer 10 in a depth direction. The concentration distribution of magnesium is controlled by adjusting the ion-implantation energy, the dose amount, and the number of times of ion implantation for magnesium ion implantation.

Figure 4:
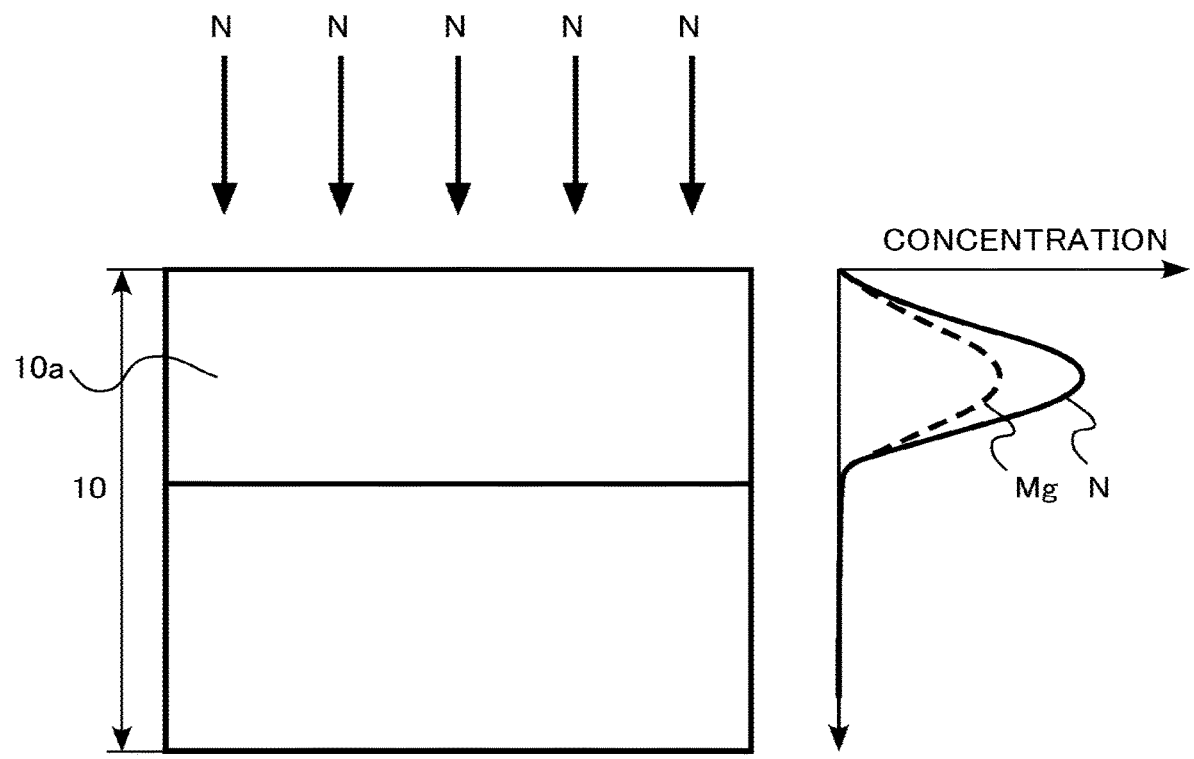
FIG. 4 is a schematic cross-sectional view illustrating the manufacturing method of semiconductor devices according to the first embodiment.

Next, nitrogen (N) is ion-implanted into the surface of the nitride semiconductor layer 10 by using a known ion implantation method (S103: FIG. 4). The nitrogen ion implantation corresponds to the second ion implantation.

Nitrogen is introduced into the impurity region 10a. For example, nitrogen may be ion-implanted multiple times with different ion-implantation energies.

The dose amount of nitrogen is larger than the dose amount of magnesium, for example. The dose amount of nitrogen is, for example, equal to or more than $1 \times 10^{11}$ cm$^{-2}$ and equal to or less than $1 \times 10^{15}$ cm$^{-2}$.

FIG. 4 also illustrates the concentration distribution of nitrogen in the depth direction immediately after nitrogen ion implantation. As illustrated in FIG. 4, for example, the concentration distribution of nitrogen formed by the second ion implantation is formed so as to include the concentration distribution of magnesium. The concentration distribution of nitrogen formed by the second ion implantation is formed so as to cover the concentration distribution of magnesium. In other words, for example, in the impurity region 10a, the nitrogen concentration at any position in the depth direction is higher than the magnesium concentration. The concentration distribution of nitrogen is controlled by adjusting the ion-implantation energy, the dose amount, and the number of times of ion implantation for nitrogen ion implantation.

Figure 5:
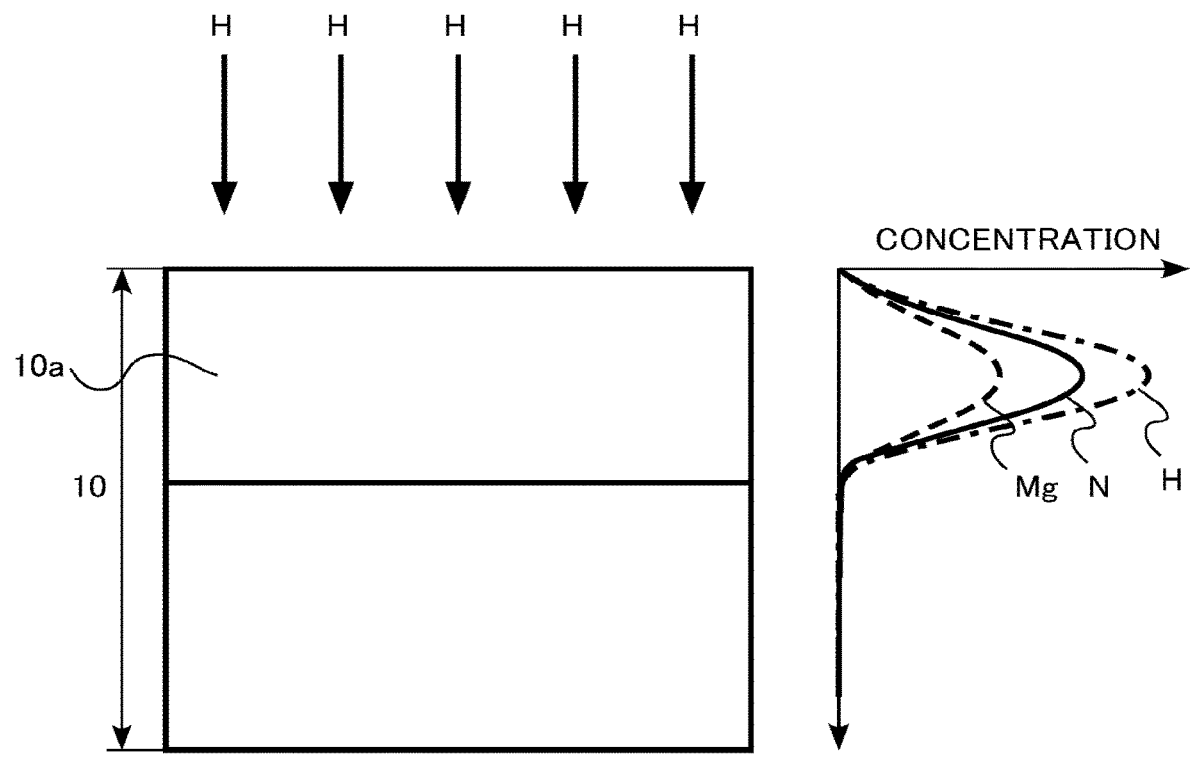
FIG. 5 is a schematic cross-sectional view illustrating the manufacturing method of semiconductor devices according to the first embodiment.

Next, hydrogen (H) is ion-implanted into the surface of the nitride semiconductor layer 10 by using a known ion implantation method (S104: FIG. 5). The hydrogen Ion implantation corresponds to the third ion implantation.

Hydrogen is introduced into the impurity region 10a. For example, hydrogen may be ion-implanted multiple times with different ion-implantation energies.

The dose amount of hydrogen in the third ion implantation is larger than the dose amount of magnesium in the first ion implantation, for example. The dose amount of hydrogen in the third ion implantation is larger than the dose amount of nitrogen in the second ion implantation, for example. The dose amount of hydrogen is, for example, equal to or more than $1 \times 10^{15}$ cm$^{-2}$ and equal to or less than $1 \times 10^{16}$ cm$^{-2}$.

FIG. 5 also illustrates the concentration distribution of hydrogen in the depth direction immediately after hydrogen ion implantation. As illustrated in FIG. 5, for example, the concentration distribution of hydrogen formed by the third ion implantation includes the concentration distribution of magnesium formed by the first ion implantation, and is formed so as to include the concentration distribution of nitrogen formed by the second ion implantation. The concentration distribution of hydrogen formed by the third ion implantation covers the concentration distribution of magnesium formed by the first ion implantation, and is formed so as to cover the concentration distribution of nitrogen formed by the second ion implantation. In other words, for example, in the impurity region 10a, the hydrogen concentration at any position in the depth direction is higher than the magnesium concentration and the nitrogen concentration. The concentration distribution of hydrogen is controlled by adjusting the ion-implantation energy, the dose amount, and the number of times of ion implantation for hydrogen ion implantation.

Figure 6:
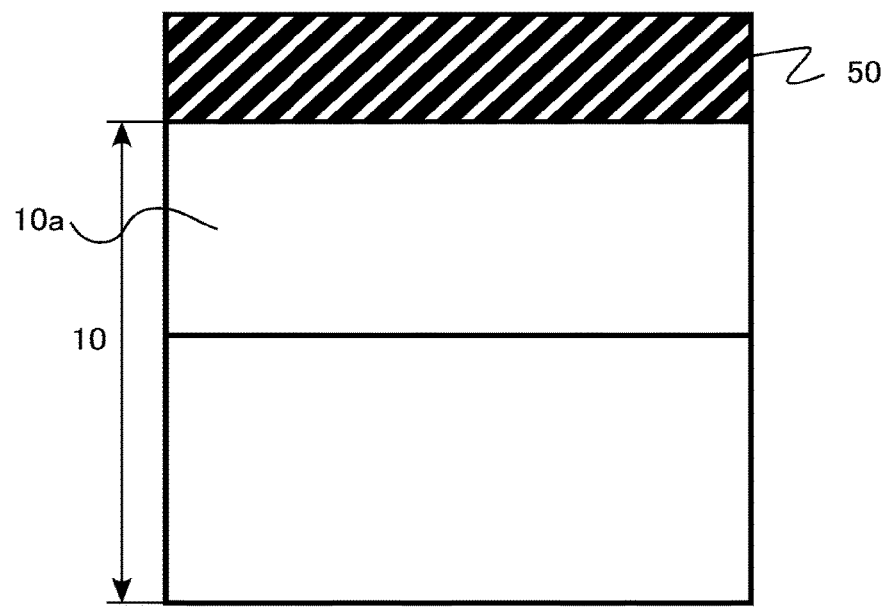
FIG. 6 is a schematic cross-sectional view illustrating the manufacturing method of semiconductor devices according to the first embodiment.

Next, a silicon oxide layer 50 is formed on the surface of the nitride semiconductor layer 10 by using a known film growth method (S105: FIG. 6). The silicon oxide layer 50 is an example of a covering layer. The covering layer is not limited to silicon oxide.

The covering layer is, for example, an insulator. The covering layer is, for example, silicon oxide, silicon nitride, silicon oxynitride, or aluminum nitride.

The covering layer is, for example, a conductor or a semiconductor. The covering layer is, for example, polycrystalline silicon.

Figure 7:
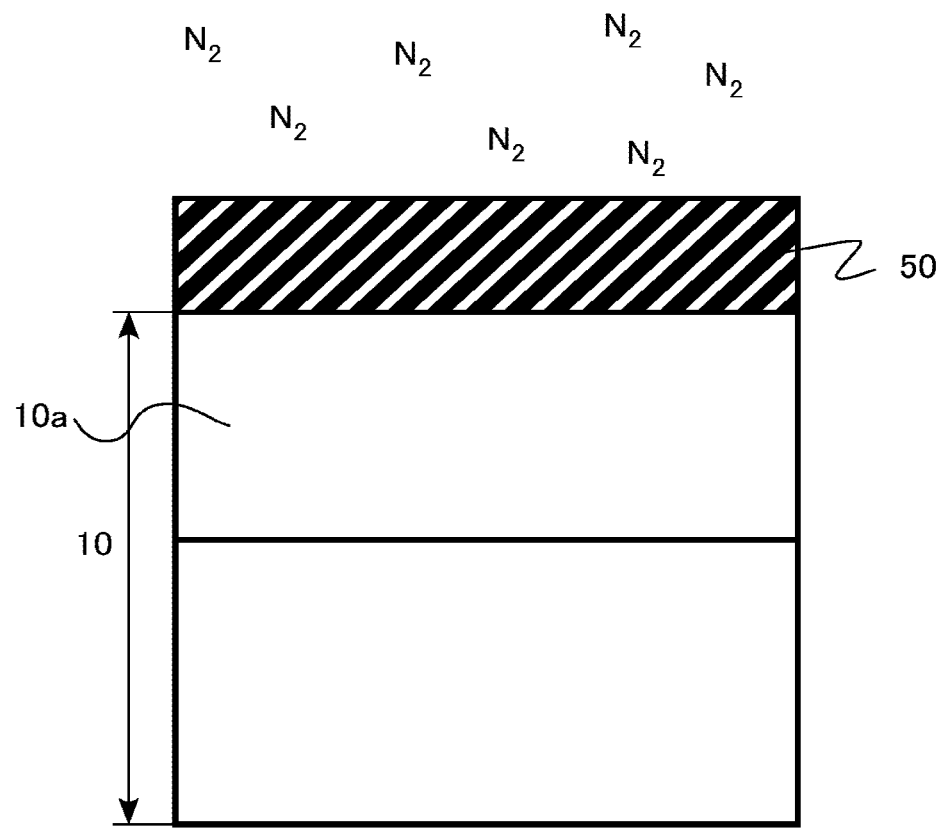
FIG. 7 is a schematic cross-sectional view illustrating the manufacturing method of semiconductor devices according to the first embodiment.

Next, the first nitrogen annealing is performed (S106: FIG. 7). The first nitrogen annealing is performed, for example, in a nitrogen gas atmosphere under a temperature condition of 950° C. or higher and 1250° C. or lower. The first nitrogen annealing is an example of the first heat treatment.

The first heat treatment is performed in a non-oxidizing atmosphere containing argon, nitrogen, hydrogen, or helium, for example.

Figure 8:
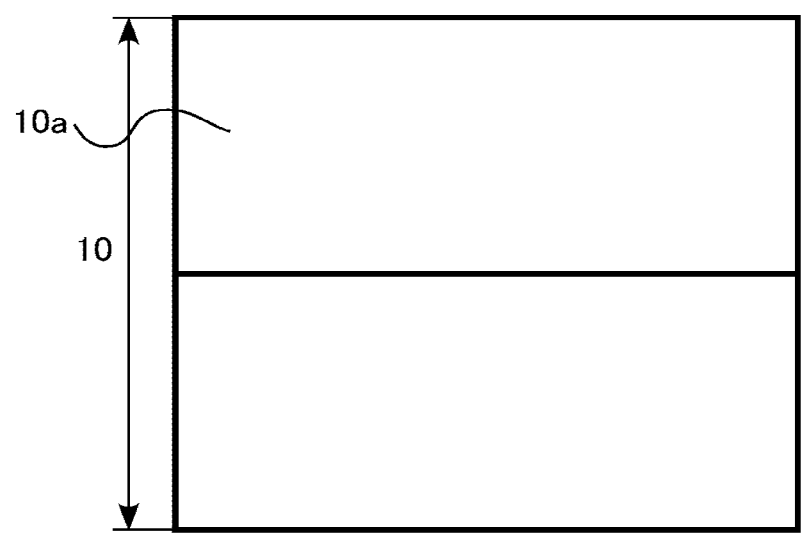
FIG. 8 is a schematic cross-sectional view illustrating the manufacturing method of semiconductor devices according to the first embodiment.

Next, the silicon oxide layer 50 on the surface of the nitride semiconductor layer 10 is removed by using a known wet etching method (S107: FIG. 8). The surface of the nitride semiconductor layer 10 is exposed.

Figure 9:
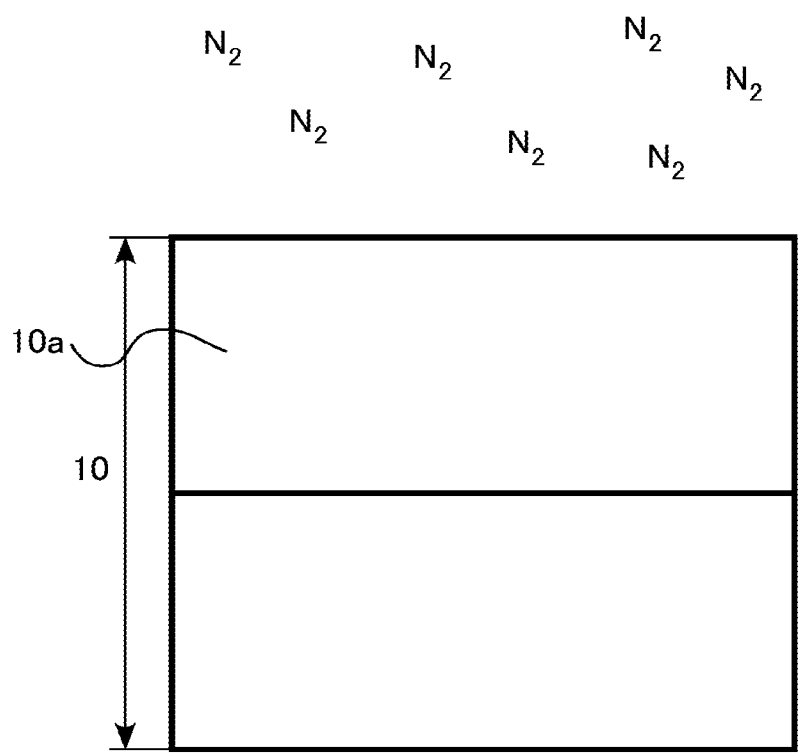
FIG. 9 is a schematic cross-sectional view illustrating the manufacturing method of semiconductor devices according to the first embodiment.

Next, the second nitrogen annealing is performed (S108: FIG. 9). The second nitrogen annealing is performed, for example, in a nitrogen gas atmosphere under a temperature condition of 950° C. or higher and 1250° C. or lower. The second nitrogen annealing is an example of the second heat treatment.

The second heat treatment is performed in a non-oxidizing atmosphere containing argon, nitrogen, or helium, for example. The second heat treatment is performed, for example, in an atmosphere containing no hydrogen.

By the above manufacturing method, the nitride semiconductor layer 10 having the impurity region 10a is manufactured. The impurity region 10a is a conductive impurity region in which conductive impurities are activated. As described above, in a case where the conductive impurity is p-type impurity magnesium, the impurity region 10a becomes a p-type impurity region in which magnesium is activated.

Hereinafter, the function and effect of the manufacturing method of semiconductor devices according to the first embodiment will be described.

In a case where the semiconductor element is formed by using the nitride semiconductor, desirably, a p-type impurity region or an n-type impurity region is formed locally at a desired position of the nitride semiconductor by an ion implantation method. When the p-type impurity region and the n-type impurity region are formed locally by using the ion implantation method, the semiconductor element can be easily improved in performance and reduced in cost.

However, even when a p-type or n-type conductive impurity is ion-implanted into the nitride semiconductor, and a heat treatment is performed, it is difficult to form a low-resistance conductive impurity region. This is because it is difficult to increase the activation rate of the conductive impurities in the nitride semiconductor by heat treatment.

In the manufacturing method of semiconductor devices according to the first embodiment, it is possible to increase the activation rate of the conductive impurities and form a low-resistance conductive impurity region. The details will be described below. Hereinafter, a case where the conductive impurity implanted into the nitride semiconductor layer by the first ion implantation is magnesium will be described as an example.

Figure 10A:
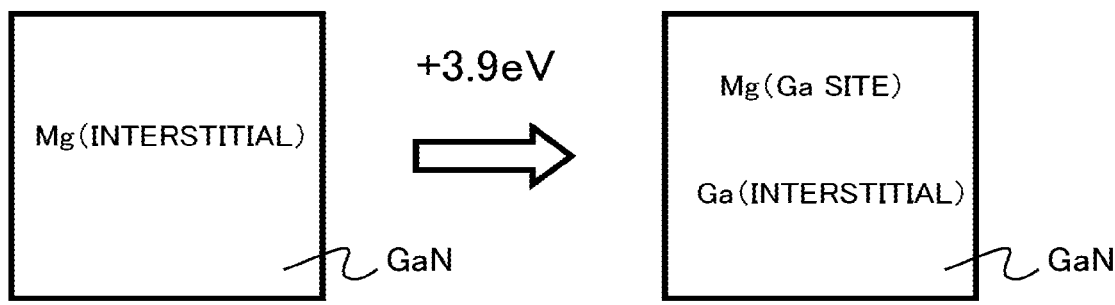
FIGS. 10A, 10B, and 10C are explanatory views of a function and effect of the manufacturing method of semiconductor devices according to the first embodiment.
Figure 10B:
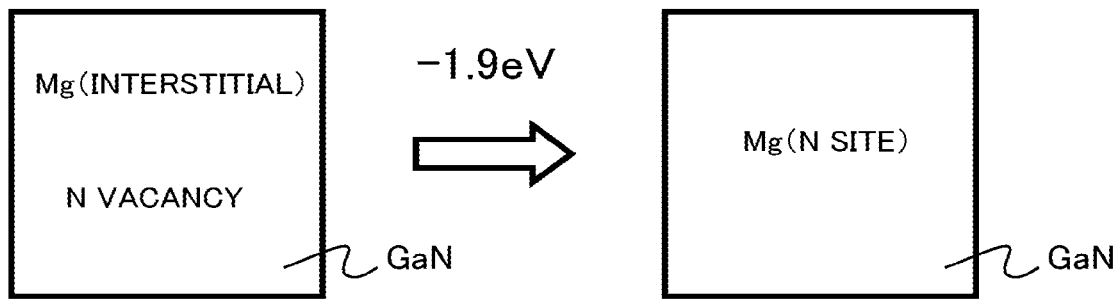
Figure 10C:
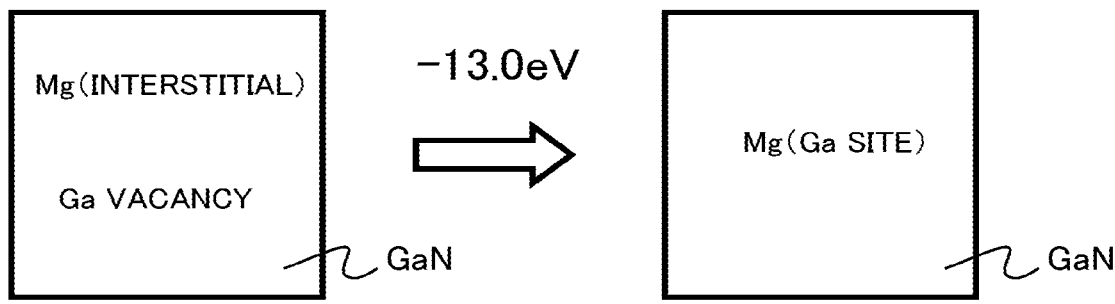

FIGS. 10A, 10B, and 10C are explanatory views of the function and effect of the manufacturing method of semiconductor devices according to the first embodiment. FIGS. 10A, 10B, and 10C illustrate calculation results of the energy difference between a state where magnesium exists at the interstitial position of gallium nitride (GaN) and a state where magnesium exists at the lattice point position. The energy difference is calculated by a first principle calculation. Hereinafter, the magnesium existing at the interstitial position is also described as interstitial magnesium.

FIG. 10A illustrates a case where nitrogen vacancies do not exist in gallium nitride, and FIG. 10B illustrates a case where nitrogen vacancies exist in gallium nitride. FIG. 10C illustrates a case where gallium vacancies exist in gallium nitride.

As illustrated in FIG. 10A, in a case where nitrogen vacancies do not exist in gallium nitride, the energy difference between a state where magnesium exists at the lattice point position and a state where magnesium exists at the interstitial position is +3.9 eV. A state where magnesium exists at the lattice point position is higher in energy and more unstable than a state where magnesium exists at the interstitial position, so that it is found that magnesium is hard to enter the lattice point position.

In the case of FIG. 10A, it is assumed that interstitial magnesium is replaced with gallium (Ga) and enters a gallium site. The replaced gallium exists at the interstitial position. Hereinafter, gallium existing at the interstitial position is referred to as interstitial gallium.

In order to activate magnesium, magnesium needs to enter the gallium site. From FIG. 10A, it is found that it is difficult for magnesium to enter the gallium site and be activated.

For example, in a case where magnesium is introduced into gallium nitride by ion implantation, nitrogen at the nitrogen site is released due to the energy of ion implantation, and nitrogen vacancies are formed. As illustrated in FIG. 10B, the energy difference between a state where magnesium exists at the nitrogen lattice point position (nitrogen site) and a state where magnesium exists at the interstitial position is −1.9 eV. A state where magnesium exists at the nitrogen lattice point position is lower in energy and more stable than a state where magnesium exists at the interstitial position, so that it is found that magnesium is easy to enter the nitrogen lattice point position.

However, in the case of FIG. 10B, interstitial magnesium is replaced with nitrogen (N) and enters the nitrogen site, so that magnesium is not activated.

As illustrated in FIG. 10C, in a case where interstitial magnesium enters the gallium vacancies formed in the gallium nitride by ion implantation, the energy difference between a state where magnesium exists at the interstitial position and a state where magnesium exists at the gallium lattice point position is about −13.0 eV. In this case, a state where magnesium exists at the gallium lattice point position is much lower in energy and more stable than a state where magnesium exists at the interstitial position, so that it is found that magnesium is easy to enter the gallium lattice point position.

However, nitrogen vacancies are easier to form than gallium vacancies. Therefore, most of the vacancies formed by the ion implantation are nitrogen vacancies. Therefore, when only magnesium ion implantation is performed, most of magnesium enters the nitrogen lattice point position.

From FIG. 10B, it is found that in a case where magnesium is introduced into gallium nitride by ion implantation, at least magnesium is necessarily prevented from entering the nitrogen site and becoming inactive.

In the manufacturing method of semiconductor devices according to the first embodiment, magnesium is implanted into the nitride semiconductor layer 10 by the first ion implantation, and nitrogen is further implanted by the second ion implantation. Therefore, the concentration of nitrogen in the nitride semiconductor layer 10 becomes high. Therefore, the nitrogen vacancies are filled with the implanted nitrogen, and the amount of nitrogen vacancies is reduced. Therefore, magnesium can be suppressed from entering the nitrogen site and becoming inactive.

Furthermore, when there are nitrogen vacancies in the nitride semiconductor layer 10, magnesium easily diffuses through the nitrogen vacancies. As a result, magnesium may diffuse into the surroundings to degrade device characteristics. In the manufacturing method of semiconductor devices according to the first embodiment, the amount of nitrogen vacancies is reduced, so that the diffusion of magnesium can be suppressed and the magnesium can be localized. Therefore, the degradation of device characteristics is suppressed. The similar function can be obtained for impurities other than magnesium, and the impurities can be localized.

Figure 11A:
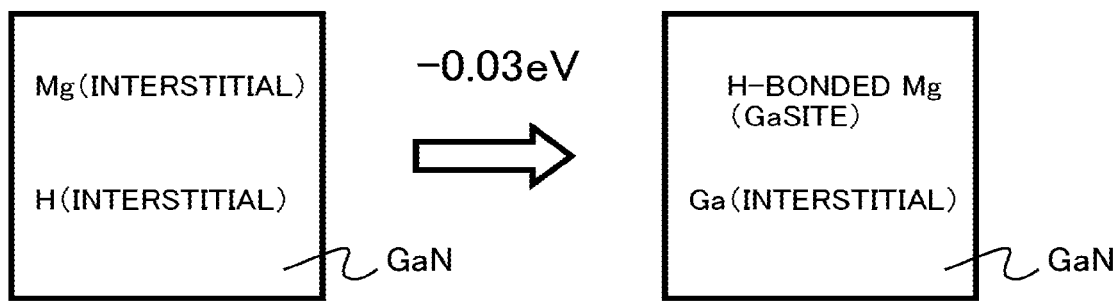
FIGS. 11A, 11B, and 11C are explanatory views of the function and effect of the manufacturing method of semiconductor devices according to the first embodiment.
Figure 11B:
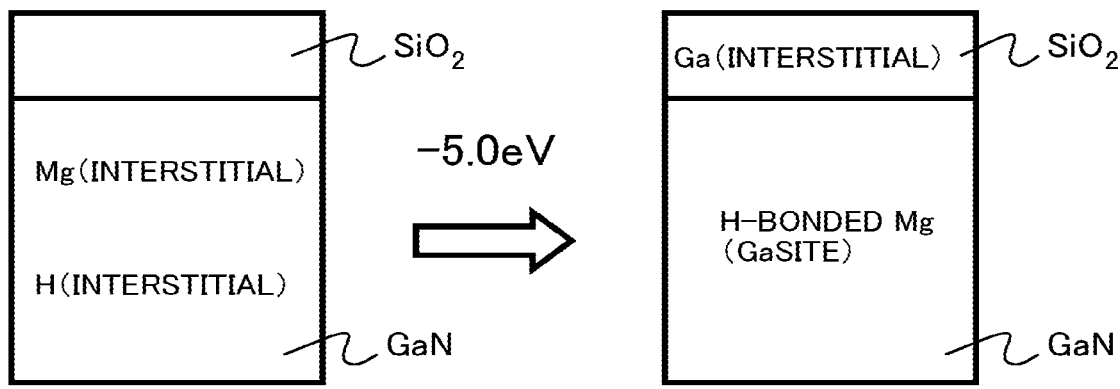
Figure 11C:
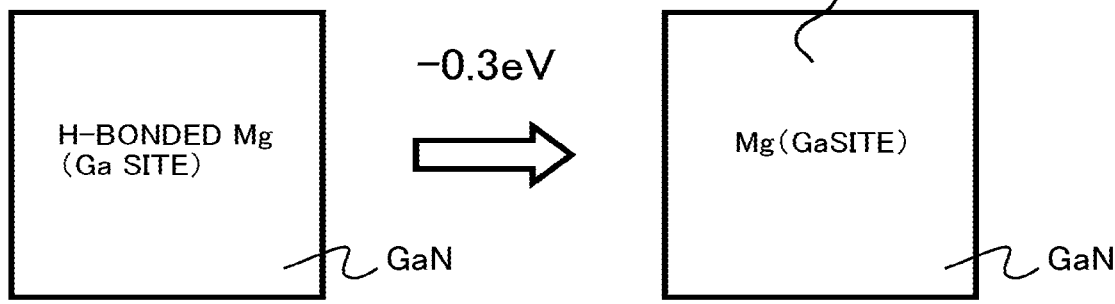

FIGS. 11A, 11B, and 11C are explanatory views of the function and effect of the manufacturing method of semiconductor devices according to the first embodiment.

FIG. 11A illustrates a calculation result of energy difference between a state where interstitial magnesium and interstitial hydrogen exist and a state where magnesium bonded with hydrogen at a gallium lattice point position and interstitial gallium exist. Hereinafter, magnesium bonded with hydrogen at the gallium lattice point position is also described as hydrogen-bonded magnesium at the gallium lattice point position.

FIG. 11B illustrates a calculation result of energy difference between a state where interstitial magnesium and interstitial hydrogen exist and a state where hydrogen-bonded magnesium at the gallium lattice point position and interstitial gallium in silicon oxide ($SiO_2$) exist.

In FIGS. 11A and 11B, it is assumed that hydrogen-bonded magnesium replaces gallium and enters the gallium site.

Further, FIG. 11C illustrates a calculation result of energy difference between a state where hydrogen-bonded magnesium exists at the gallium lattice point position and a state where hydrogen is released from magnesium existing at the gallium lattice point position to become a hydrogen molecule ($H_2$). The energy difference is calculated by a first principle calculation.

As illustrated in FIG. 11A, the energy difference between a state where interstitial magnesium and interstitial hydrogen exist and a state where hydrogen-bonded magnesium at the gallium lattice point position and interstitial gallium exist is −0.03 eV. A state where hydrogen-bonded magnesium exists at the gallium lattice point position is much higher in energy and more stable than a state where hydrogen-bonded magnesium exists at the interstitial position, so that it is found that hydrogen-bonded magnesium is easy to enter the gallium lattice point position.

As illustrated in FIG. 11B, the energy difference between a state where interstitial magnesium and interstitial hydrogen exist and a state where hydrogen-bonded magnesium at the gallium lattice point position and interstitial gallium in silicon oxide exist is −5.0 eV. In a case where interstitial gallium enters silicon oxide, hydrogen-bonded magnesium at the gallium lattice point position is more energetically stable compared to a case where interstitial gallium enters gallium nitride. Therefore, it is found that hydrogen-bonded magnesium is easier to enter the gallium lattice point position.

In the manufacturing method of semiconductor devices according to the first embodiment, magnesium is implanted into the nitride semiconductor layer 10 by the first ion implantation, nitrogen is implanted by the second ion implantation, and further hydrogen is ion-implanted by the third ion implantation. Then, the first nitrogen annealing is performed. By the first heat treatment, magnesium and hydrogen are combined in the nitride semiconductor layer 10 to form hydrogen-bonded magnesium. Then, hydrogen-bonded magnesium enters the lattice point position.

In the manufacturing method of semiconductor devices according to the first embodiment, in particular, the silicon oxide layer 50 is formed as a covering layer on the surface of the nitride semiconductor layer 10. Then, the first nitrogen annealing is performed with the silicon oxide layer 50 provided. The first nitrogen annealing is an annealing in a capped state (cap annealing). This cap has the effect of retaining hydrogen in the nitride semiconductor. Furthermore, as illustrated in FIG. 11B, by allowing gallium element to escape into the cap, hydrogen-bonded magnesium efficiently enters the gallium lattice point position. That is, the interstitial gallium enters the silicon oxide layer 50, so that hydrogen-bonded magnesium is easier to enter the gallium lattice point position.

Incidentally, hydrogen-bonded magnesium is inactive in gallium nitride. In order to activate magnesium in gallium nitride, it is necessary to release hydrogen from hydrogen-bonded magnesium.

As illustrated in FIG. 11C, the energy difference between a state where hydrogen-bonded magnesium exists at the gallium lattice point position and a state where hydrogen is released from magnesium existing at the gallium lattice point position to become a hydrogen molecule ($H_2$) is −0.3 eV. A state where hydrogen is released from magnesium existing at the lattice point position to become a hydrogen molecule ($H_2$) is lower in energy and more stable than a state where hydrogen-bonded magnesium exists at the gallium lattice point position, so that it is found that hydrogen is easily released from magnesium to become a hydrogen molecule ($H_2$).

In the manufacturing method of semiconductor devices according to the first embodiment, the surface of the nitride semiconductor layer 10 is exposed by removing the silicon oxide layer 50 on the surface of the nitride semiconductor layer 10. In this state, the second nitrogen annealing is performed. The second heat treatment is an annealing after the cap is removed (capless annealing).

By making the second nitrogen annealing a capless annealing, it becomes difficult to retain hydrogen in the nitride semiconductor. Therefore, the second nitrogen annealing promotes outward diffusion of hydrogen in the nitride semiconductor layer 10. Therefore, hydrogen is released from magnesium, and a state where magnesium enters the gallium lattice point position, that is, a state where magnesium is activated is realized.

As described above, in the manufacturing method of semiconductor devices according to the first embodiment, conductive impurities are implanted into the nitride semiconductor layer 10 by the first ion implantation, nitrogen is implanted by the second ion implantation, further hydrogen is ion-implanted by the third ion implantation, and the first heat treatment (cap annealing) and the second heat treatment (capless annealing) are performed, so that the activation rate of the conductive impurities can be increased, and the low-resistance conductive impurity region can be formed.

The covering layer is preferably silicon nitride from the viewpoint of suppressing outward diffusion of hydrogen from the nitride semiconductor layer 10 and increasing the production efficiency of hydrogen-bonded magnesium. The easiness of diffusing gallium atoms in silicon nitride is equivalent to the easiness of diffusing gallium atoms in silicon oxide. This is because the interaction of gallium with oxygen and nitrogen is weaker than the interaction of gallium with silicon.

The first heat treatment is preferably performed in an atmosphere containing hydrogen from the viewpoint of suppressing outward diffusion of hydrogen from the nitride semiconductor layer 10 and increasing the production efficiency of hydrogen-bonded magnesium. Further, the first heat treatment is preferably performed in an atmosphere containing helium. When the passage of hydrogen in the covering layer is blocked by the atmosphere containing helium, outward diffusion of hydrogen can be suppressed.

The second heat treatment is preferably performed in an atmosphere containing no hydrogen from the viewpoint of promoting outward diffusion of hydrogen from the nitride semiconductor layer 10. Further, the second heat treatment is preferably performed at a pressure lower than that of the first heat treatment from the viewpoint of promoting outward diffusion of hydrogen from the nitride semiconductor layer 10. Further, the second heat treatment is preferably performed at a pressure lower than atmospheric pressure from the viewpoint of promoting outward diffusion of hydrogen from the nitride semiconductor layer 10. Further, the second heat treatment is preferably performed after removing the covering layer from the viewpoint of promoting outward diffusion of hydrogen from the nitride semiconductor layer 10.

From the viewpoint of reducing the nitrogen vacancies in the nitride semiconductor layer 10 and promoting the entry of magnesium into the gallium site, the dose amount of nitrogen in the second ion implantation is preferably greater than the dose amount of magnesium in the first ion implantation. Further, it is preferable that the concentration of nitrogen in the second ion implantation is higher at any position than the concentration of magnesium in the first ion implantation.

From the viewpoint of reducing the nitrogen vacancies in the nitride semiconductor layer 10 and promoting the entry of magnesium into the gallium site, as illustrated in FIG. 4, the concentration distribution of nitrogen formed by the second ion implantation preferably includes the concentration distribution of magnesium formed by the first ion implantation. Excess nitrogen can be diffused into a coated film so as to prevent a problem caused by nitrogen remaining in gallium nitride. Rather, a sufficient amount of nitrogen is introduced so as to obtain an additional effect of increasing the nitrogen density in the coated film becomes high and facilitating etching.

From the viewpoint of increasing the production efficiency of hydrogen-bonded magnesium in the nitride semiconductor layer 10, preferably, the hydrogen dose amount of the third ion implantation is larger than the magnesium dose amount of the first ion implantation and larger than the nitrogen dose amount of the second ion implantation.

From the viewpoint of increasing the production efficiency of hydrogen-bonded magnesium in the nitride semiconductor layer 10, preferably, the concentration distribution of hydrogen formed by the third ion implantation includes the concentration distribution of magnesium formed by the first ion implantation.

From the viewpoint of increasing the production efficiency of hydrogen-bonded magnesium in the nitride semiconductor layer 10, the hydrogen dose amount of the third ion implantation is preferably equal to or more than $1 \times 10^{15}$ cm$^{-2}$. Since hydrogen easily diffuses in a C-axis direction (a direction perpendicular to a substrate), when $1 \times 10^{15}$ cm$^{-2}$ or more of hydrogen is introduced, it is possible to reliably diffuse to the adjacent position of magnesium of the first ion implantation. Eventually, hydrogen is released to the outside so as to prevent a problem caused by hydrogen remaining in gallium nitride. Therefore, a sufficient amount of hydrogen can be introduced without worrying about the remaining hydrogen.

The hydrogen dose amount of the third ion implantation is preferably equal to or less than $1 \times 10^{16}$ cm$^{-2}$. Hydrogen is a light element, but there is a possibility that a slight amount of damage to the substrate may occur in the case of ion implantation in excess of $1 \times 10^{16}$ cm$^{-2}$. Incidentally, hydrogen-bonded magnesium can be sufficiently produced even at $1 \times 10^{16}$ cm$^{-2}$ or less.

Incidentally, a case where the nitride semiconductor layer 10 is gallium nitride (GaN) has been described as an example. However, if the nitride semiconductor layer 10 includes a "GaN-based semiconductor" such as AlGaN, AlN, or InGaN, the same function and effect as those of gallium nitride can be realized.

A case where magnesium (Mg) is ion-implanted by the first ion implantation has been described as an example. However, the element to be implanted by the first ion implantation is not limited to magnesium (Mg), and the same function and effect as those of magnesium can be realized when the element is at least one element selected from the group consisting of beryllium (Be), magnesium (Mg), calcium (Ca), strontium (Sr), barium (Ba), zinc (Zn), cadmium (Cd), silicon (Si), germanium (Ge), and tin (Sn).

In a case where the element is a p-type impurity, that is, beryllium (Be), magnesium (Mg), calcium (Ca), strontium (Sr), barium (Ba), zinc (Zn), or cadmium (Cd), the impurity region 10a becomes a p-type impurity region. A process until the magnesium of the p-type impurity is activated is described by using FIGS. 10A, 10B, 10C, 11A, 11B, and 11C. However, a similar process is established even in other p-type impurities.

In a case where the element is an n-type impurity, that is, silicon (Si), germanium (Ge), or tin (Sn), the impurity region 10a becomes an n-type impurity region. Hereinafter, it will be described that the same function as that of the p-type impurity can be also obtained for the n-type impurity. A case where the n-type impurity is silicon will be described as an example.

Figure 12A:
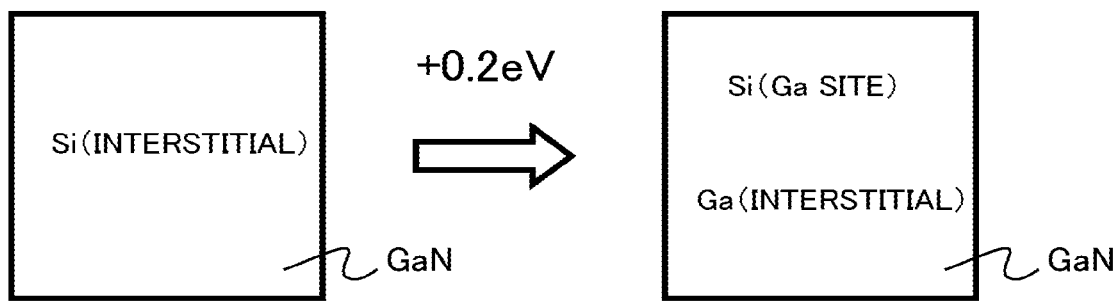
FIGS. 12A, 12B, and 12C are explanatory views of the function and effect of the manufacturing method of semiconductor devices according to the first embodiment.
Figure 12B:
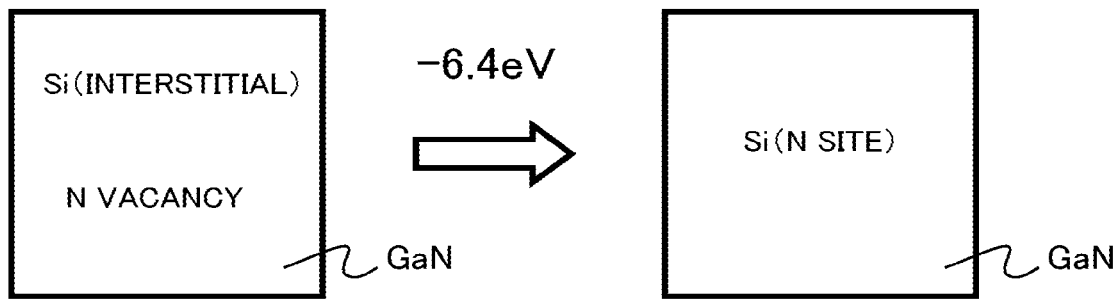
Figure 12C:
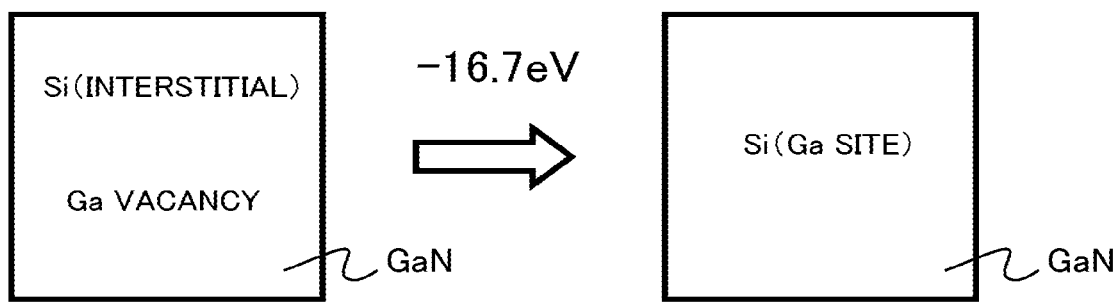

FIGS. 12A, 12B, and 12C are explanatory views of the function and effect of the manufacturing method of semiconductor devices according to the first embodiment. FIGS. 12A, 12B, and 12C illustrate calculation results of the energy difference between a state where silicon exists at the interstitial position of gallium nitride (GaN) and a state where silicon exists at the lattice point position. The energy difference is calculated by a first principle calculation. Hereinafter, the silicon existing at the interstitial position is also described as interstitial silicon.

FIG. 12A illustrates a case where nitrogen vacancies do not exist in gallium nitride, and FIG. 12B illustrates a case where nitrogen vacancies exist in gallium nitride. FIG. 12C illustrates a case where gallium vacancies exist in gallium nitride.

As illustrated in FIG. 12A, in a case where nitrogen vacancies do not exist in gallium nitride, the energy difference between a state where silicon exists at the lattice point position and a state where silicon exists at the interstitial position is +0.2 eV. A state where silicon exists at the lattice point position is higher in energy and more unstable than a state where silicon exists at the interstitial position, so that it is found that silicon is hard to enter the lattice point position.

In the case of FIG. 12A, it is assumed that interstitial silicon is replaced with gallium (Ga) and enters the gallium site. The replaced gallium exists at the interstitial position. Hereinafter, gallium existing at the interstitial position is referred to as interstitial gallium.

In order to activate silicon, silicon needs to enter the gallium site. From FIG. 12A, it is found that it is difficult for silicon to enter the gallium site and be activated.

For example, in a case where silicon is introduced into gallium nitride by ion implantation, nitrogen at the nitrogen site is released due to the energy of ion implantation, and nitrogen vacancies are formed. As illustrated in FIG. 12B, the energy difference between a state where silicon exists at the nitrogen lattice point position (nitrogen site) and a state where silicon exists at the interstitial position is −6.4 eV. A state where silicon exists at the nitrogen lattice point position is lower in energy and more stable than a state where silicon exists at the interstitial position, so that it is found that silicon is easy to enter the nitrogen lattice point position.

However, in the case of FIG. 12B, interstitial silicon is replaced with nitrogen (N) and enters the nitrogen site, so that silicon is not activated.

Incidentally, as illustrated in FIG. 12C, in a case where interstitial silicon enters the gallium vacancies formed in the gallium nitride by ion implantation, the energy difference between a state where silicon exists at the interstitial position and a state where silicon exists at the gallium lattice point position is about −16.7 eV. In this case, a state where silicon exists at the gallium lattice point position is much lower in energy and more stable than a state where silicon exists at the interstitial position, so that it is found that silicon is easy to enter the gallium lattice point position.

However, nitrogen vacancies are easier to form than gallium vacancies. Therefore, most of the vacancies formed by the ion implantation are nitrogen vacancies. Therefore, when only silicon ion implantation is performed, most of silicon enters the nitrogen lattice point position.

From FIG. 12B, it is found that in a case where silicon is introduced into gallium nitride by ion implantation, at least silicon is necessarily prevented from entering the nitrogen site and becoming inactive.

In another manufacturing method of semiconductor devices according to the first embodiment, for example, silicon is implanted into the nitride semiconductor layer 10 by the first ion implantation, and nitrogen is further implanted by the second ion implantation. Therefore, the concentration of nitrogen in the nitride semiconductor layer 10 becomes high. Therefore, the nitrogen vacancies are filled with the implanted nitrogen, and the amount of nitrogen vacancies is reduced. Therefore, silicon can be prevented from entering the nitrogen site and becoming inactive.

Figure 13A:
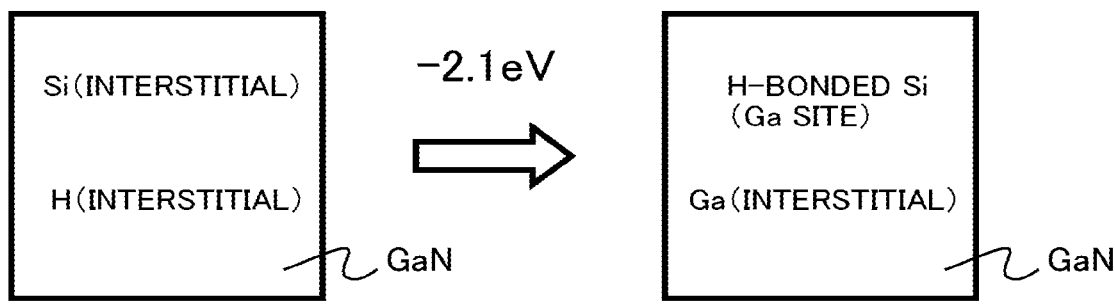
FIGS. 13A, 13B, and 13C are explanatory views of the function and effect of the manufacturing method of semiconductor devices according to the first embodiment.
Figure 13B:
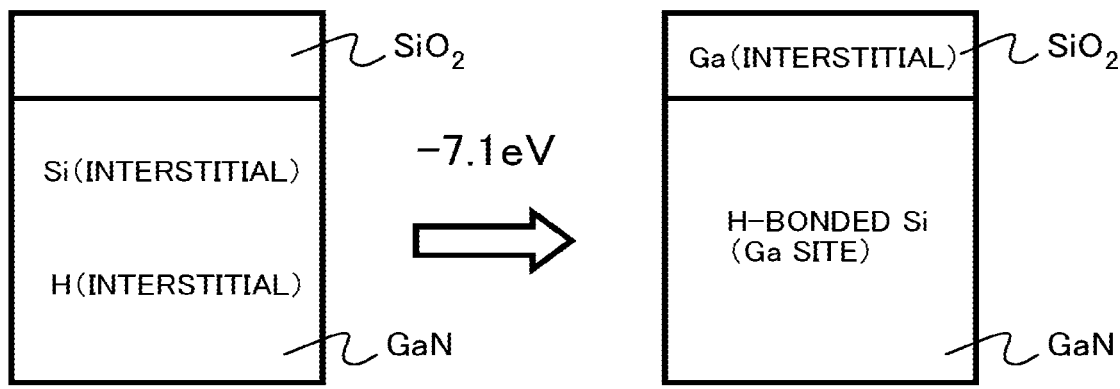
Figure 13C:
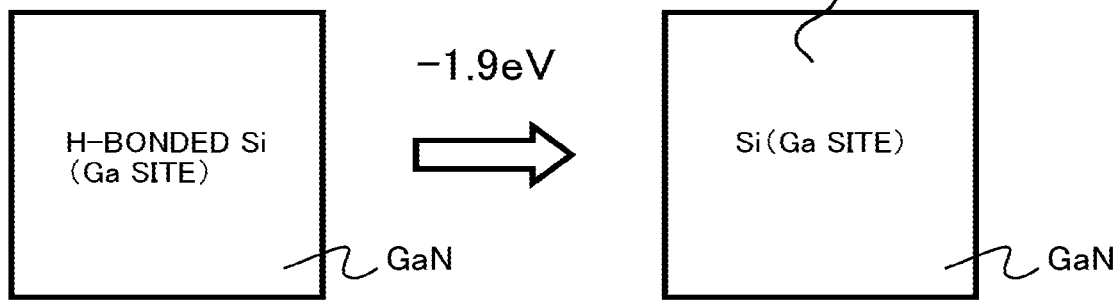

FIGS. 13A, 13B, and 13C are explanatory views of the function and effect of the manufacturing method of semiconductor devices according to the first embodiment.

FIG. 13A illustrates a calculation result of energy difference between a state where interstitial silicon and interstitial hydrogen exist and a state where silicon bonded with hydrogen at the gallium lattice point position and interstitial gallium exist. Hereinafter, silicon bonded with hydrogen at the gallium lattice point position is also described as hydrogen-bonded silicon at the gallium lattice point position.

FIG. 13B illustrates a calculation result of energy difference between a state where interstitial silicon and interstitial hydrogen exist and a state where hydrogen bonded silicon at the gallium lattice point position and interstitial gallium in silicon oxide ($SiO_2$) exist.

In FIGS. 13A and 13B, it is assumed that hydrogen-bonded silicon replaces gallium and enters the gallium site.

Further, FIG. 13C illustrates a calculation result of energy difference between a state where hydrogen-bonded silicon exists at the gallium lattice point position and a state where hydrogen is released from silicon existing at the gallium lattice point position to become a hydrogen molecule ($H_2$). The energy difference is calculated by a first principle calculation.

As illustrated in FIG. 13A, the energy difference between a state where interstitial silicon and interstitial hydrogen exist and a state where hydrogen-bonded silicon at the gallium lattice point position and interstitial gallium exist is −2.1 eV. A state where hydrogen-bonded silicon exists at the gallium lattice point position is lower in energy and more stable than a state where hydrogen-bonded silicon exists at the interstitial position, so that it is found that hydrogen-bonded silicon is easy to enter the gallium lattice point position.

As illustrated in FIG. 13B, the energy difference between a state where interstitial silicon and interstitial hydrogen exist and a state where hydrogen-bonded silicon at the gallium lattice point position and interstitial gallium in silicon oxide exist is −7.1 eV. In a case where interstitial gallium enters silicon oxide, hydrogen-bonded silicon at the gallium lattice point position is more energetically stable compared to a case where interstitial gallium enters gallium nitride. Therefore, it is found that hydrogen-bonded silicon is easier to enter the gallium lattice point position.

As described above, the same function as that of the p-type impurity can be obtained for the n-type impurity. Incidentally, a process until the silicon of the p-type impurity is activated is described by using FIGS. 12A, 12B, 12C, 13A, 13B, and 13C. However, a similar process is established even in other n-type impurities.

As described above, in the manufacturing method of semiconductor devices according to the first embodiment, it is possible to provide a manufacturing method of semiconductor devices in which a low-resistance impurity region is locally formed in a nitride semiconductor by using an ion implantation method.

Second Embodiment

A manufacturing method of semiconductor devices according to a second embodiment includes: performing a first ion implantation implanting at least one element selected from a group consisting of beryllium (Be), magnesium (Mg), calcium (Ca), strontium (Sr), barium (Ba), zinc (Zn), cadmium (Cd), silicon (Si), germanium (Ge), and tin (Sn) into a nitride semiconductor layer; performing a second ion implantation implanting nitrogen (N) into the nitride semiconductor layer; performing a third ion implantation implanting hydrogen (H) into the nitride semiconductor layer; forming a covering layer on a surface of the nitride semiconductor layer after the first ion implantation, the second ion implantation, and the third ion implantation; performing a first heat treatment after forming the covering layer; and performing a second heat treatment under a condition different from a condition of the first heat treatment after the first heat treatment. The first heat treatment is performed in an atmosphere containing hydrogen, and the second heat treatment is performed in an atmosphere containing no hydrogen or in an atmosphere having a hydrogen partial pressure lower than the hydrogen partial pressure of the first heat treatment.

The manufacturing method of semiconductor devices according to the second embodiment is different from the manufacturing method of semiconductor devices according to the first embodiment in that the covering layer is not removed before the second heat treatment, and the condition of the first heat treatment and the condition of the second heat treatment are different. Hereinafter, the description overlapping the first embodiment is omitted.

Figure 14:
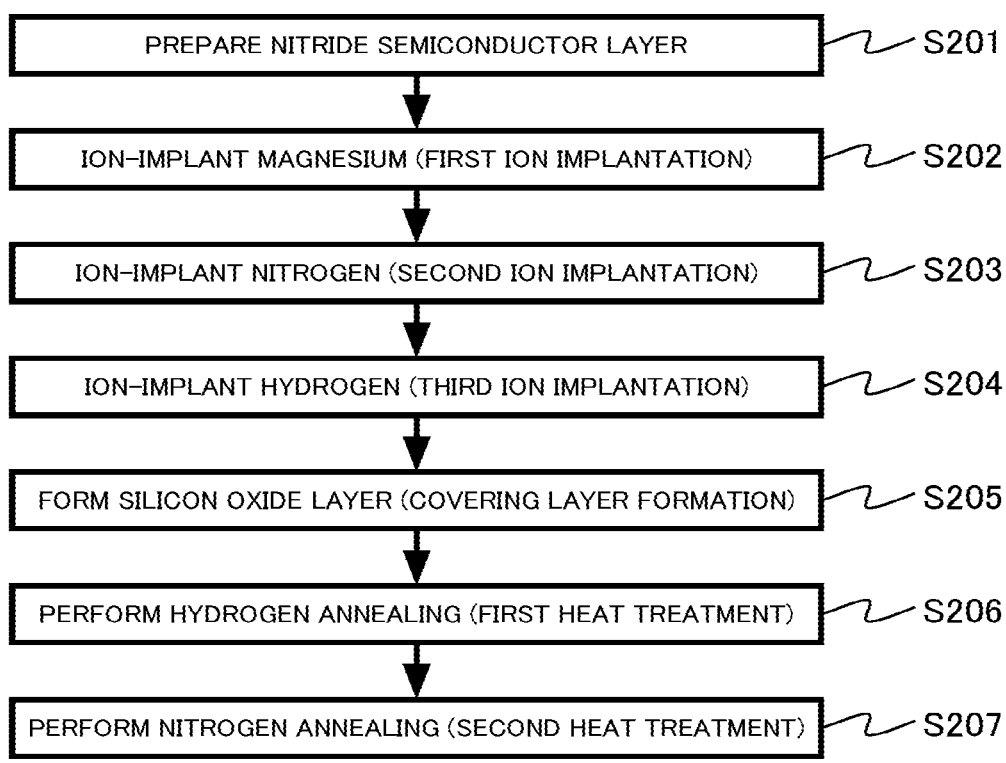
FIG. 14 is a diagram illustrating a manufacturing flow of a manufacturing method of semiconductor devices according to a second embodiment.

FIG. 14 is a diagram illustrating a manufacturing flow of the manufacturing method of semiconductor devices according to the second embodiment. The semiconductor device in the second embodiment is a nitride semiconductor layer having a p-type impurity region.

The manufacturing method of semiconductor devices according to the second embodiment includes nitride semiconductor layer preparation step S201, magnesium ion implantation step S202 (first ion implantation), nitrogen ion implantation step S203 (second ion implantation), hydrogen ion implantation step S204 (third ion implantation), silicon oxide layer formation step S205 (covering layer formation), hydrogen annealing step S206 (first heat treatment), and nitrogen annealing step S207 (second heat treatment).

In the manufacturing method of semiconductor devices according to the second embodiment, after the first heat treatment, the second heat treatment is performed under a condition different from the condition of the first heat treatment without removing the covering layer.

The procedure up to the formation of the covering layer is the same as in the manufacturing method of semiconductor devices according to the first embodiment.

Next, hydrogen annealing is performed (S206). The hydrogen annealing is performed, for example, in an atmosphere containing hydrogen at a temperature condition of 950° C. or higher and 1250° C. or lower. The hydrogen annealing is an example of the first heat treatment. The hydrogen partial pressure in the atmosphere during the hydrogen annealing is, for example, 100%.

Next, nitrogen annealing is performed (S207). The nitrogen annealing is performed, for example, in a nitrogen gas atmosphere under a temperature condition of 950° C. or higher and 1250° C. or lower. The nitrogen annealing is an example of the second heat treatment.

The second heat treatment is performed in an atmosphere containing no hydrogen or in an atmosphere having a hydrogen partial pressure lower than that in the first heat treatment. The second heat treatment is performed in a non-oxidizing atmosphere containing argon, nitrogen, or helium, for example.

In the manufacturing method of semiconductor devices according to the second embodiment, the silicon oxide layer 50 is formed as a covering layer on the surface of the nitride semiconductor layer 10. Then, hydrogen annealing is performed with the silicon oxide layer 50 provided. The hydrogen annealing is an annealing in a capped state (cap annealing). This cap has the effect of retaining hydrogen in the nitride semiconductor. In particular, by performing in an atmosphere containing hydrogen, outward diffusion of hydrogen from the nitride semiconductor is suppressed.

As in the manufacturing method of semiconductor devices according to the first embodiment, by allowing gallium element to escape into the cap, hydrogen-bonded magnesium efficiently enters the gallium lattice point position. That is, the interstitial gallium enters the silicon oxide layer 50, so that hydrogen-bonded magnesium is easier to enter the gallium lattice point position.

Incidentally, hydrogen-bonded magnesium is inactive in gallium nitride. In order to activate magnesium in gallium nitride, it is necessary to release hydrogen from hydrogen-bonded magnesium.

In the manufacturing method of semiconductor devices according to the second embodiment, the second heat treatment is performed in an atmosphere containing no hydrogen or in an atmosphere having a hydrogen partial pressure lower than the hydrogen partial pressure of the first heat treatment. Therefore, outward diffusion of hydrogen in the nitride semiconductor layer 10 is promoted. Therefore, hydrogen is released from the hydrogen-bonded magnesium, and a state where magnesium enters the gallium lattice point position, that is, a state where magnesium is activated is realized. A partial pressure of hydrogen in an atmosphere of the first heat treatment is preferably equal to or higher than 1%, and more preferably equal to or higher than 10%. A partial pressure of hydrogen in an atmosphere of the second heat treatment is preferably equal to or lower than 100 ppm, and more preferably equal to or lower than 10 ppm.

As described above, in the manufacturing method of semiconductor devices according to the second embodiment, as in the first embodiment, it is possible to provide a manufacturing method of semiconductor devices in which a low-resistance impurity region is locally formed in a nitride semiconductor by using an ion implantation method.

Third Embodiment

A manufacturing method of semiconductor devices according to a third embodiment includes: performing a first ion implantation implanting at least one element selected from a group consisting of beryllium (Be), magnesium (Mg), calcium (Ca), strontium (Sr), barium (Ba), zinc (Zn), cadmium (Cd), silicon (Si), germanium (Ge), and tin (Sn) into a nitride semiconductor layer; performing a second ion implantation implanting nitrogen (N) into the nitride semiconductor layer; performing a third ion implantation implanting hydrogen (H) into the nitride semiconductor layer; forming a covering layer on a surface of the nitride semiconductor layer after the first ion implantation, the second ion implantation, and the third ion implantation; performing a first heat treatment after forming the covering layer; and performing a second heat treatment under a condition different from a condition of the first heat treatment after the first heat treatment. The second heat treatment is performed at a pressure lower than the pressure of the first heat treatment.

The manufacturing method of semiconductor devices according to the third embodiment is different from the manufacturing method of semiconductor devices according to the first embodiment in that the covering layer is not removed before the second heat treatment, and the condition of the first heat treatment and the condition of the second heat treatment are different. Further, the manufacturing method is different from the manufacturing method of semiconductor devices according to the second embodiment in that the second heat treatment is performed at a pressure lower than that of the first heat treatment. Hereinafter, the description overlapping the first embodiment and the second embodiment is omitted.

Figure 15:
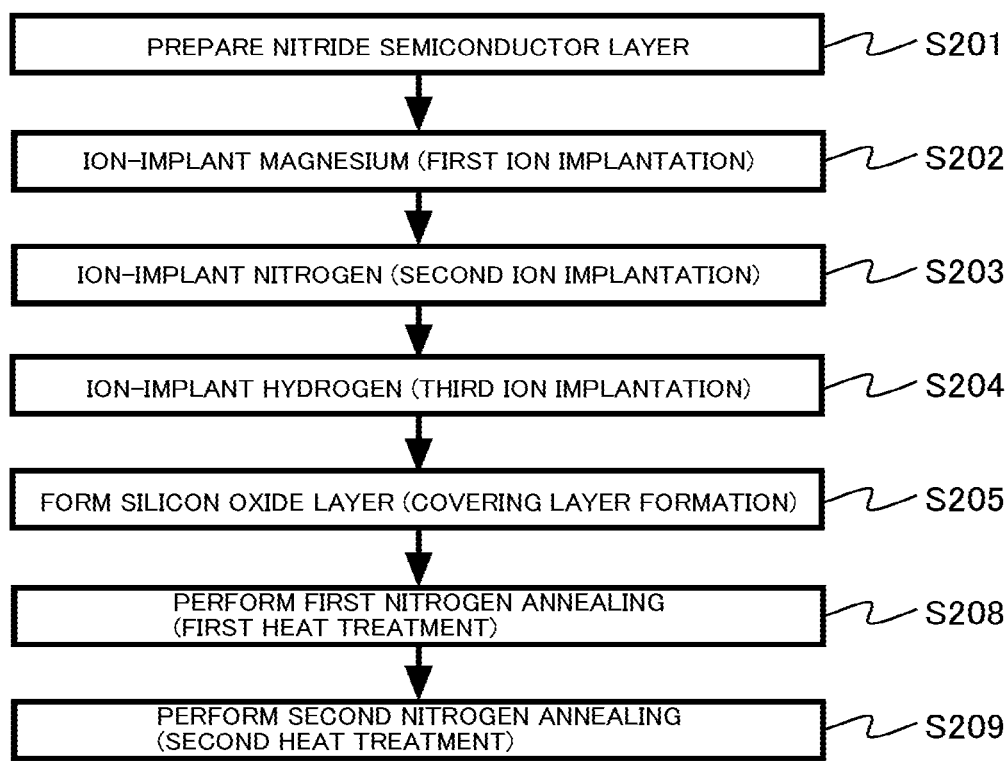
FIG. 15 is a view illustrating a manufacturing flow of a manufacturing method of semiconductor devices according to a third embodiment.

FIG. 15 is a view illustrating a manufacturing flow of the manufacturing method of semiconductor devices according to the third embodiment. The semiconductor device of the third embodiment is a nitride semiconductor layer having a p-type impurity region.

The manufacturing method of semiconductor devices according to the third embodiment includes nitride semiconductor layer preparation step S201, magnesium ion implantation step S202 (first ion implantation), nitrogen ion implantation step S203 (second ion implantation), hydrogen ion implantation step S204 (third ion implantation), silicon oxide layer formation step S205 (covering layer formation), first nitrogen annealing step S208 (first heat treatment), and second nitrogen annealing step S209 (second heat treatment).

In the manufacturing method of semiconductor devices according to the third embodiment, after the first heat treatment, the second heat treatment is performed under a condition different from the condition of the first heat treatment without removing the covering layer.

The procedure up to the formation of the covering layer is the same as in the manufacturing method of semiconductor devices according to the first embodiment.

Next, the first nitrogen annealing is performed (S208). The first nitrogen annealing is performed, for example, in a nitrogen gas atmosphere under a temperature condition of 950° C. or higher and 1250° C. or lower. The first nitrogen annealing is performed at atmospheric pressure, for example. The first nitrogen annealing is an example of the first heat treatment.

The first heat treatment is performed in a non-oxidizing atmosphere containing argon, nitrogen, hydrogen, or helium, for example.

Next, a second nitrogen annealing is performed (S209). The second nitrogen annealing is performed at a lower pressure than that of the first nitrogen anneal. The second nitrogen annealing is performed at a pressure lower than atmospheric pressure, for example. The second nitrogen annealing is performed, for example, in a nitrogen gas atmosphere under a temperature condition of 950° C. or higher and 1250° C. or lower. The second nitrogen annealing is an example of the second heat treatment.

The second heat treatment is performed in a non-oxidizing atmosphere containing argon, nitrogen, or helium, for example. The second heat treatment is performed, for example, in an atmosphere containing no hydrogen.

In the manufacturing method of semiconductor devices according to the third embodiment, the silicon oxide layer 50 is formed as a covering layer on the surface of the nitride semiconductor layer 10. Then, the first nitrogen annealing is performed with the silicon oxide layer 50 provided. The first nitrogen annealing is an annealing in a capped state (cap annealing). This cap has the effect of retaining hydrogen in the nitride semiconductor.

As in the manufacturing method of semiconductor devices according to the first embodiment, by allowing gallium element to escape into the cap, hydrogen-bonded magnesium efficiently enters the gallium lattice point position. That is, the interstitial gallium enters the silicon oxide layer 50, so that hydrogen-bonded magnesium is easier to enter the gallium lattice point position.

Incidentally, hydrogen-bonded magnesium is inactive in gallium nitride. In order to activate magnesium in gallium nitride, it is necessary to release hydrogen from hydrogen-bonded magnesium.

In the manufacturing method of semiconductor devices according to the third embodiment, the second heat treatment is performed at a pressure lower than that of the first heat treatment. For example, the first heat treatment is performed at atmospheric pressure, and the second heat treatment is performed at a pressure lower than atmospheric pressure.

Therefore, outward diffusion of hydrogen in the nitride semiconductor layer 10 is promoted. Therefore, hydrogen is released from the hydrogen-bonded magnesium, and a state where magnesium enters the gallium lattice point position, that is, a state where magnesium is activated is realized.

As described above, in the manufacturing method of semiconductor devices according to the third embodiment, as in the first embodiment, it is possible to provide a manufacturing method of semiconductor devices in which a low-resistance impurity region is locally formed in a nitride semiconductor by using an ion implantation method.

Fourth Embodiment

A manufacturing method of semiconductor devices according to a fourth embodiment is different from the manufacturing method of semiconductor devices according to the first embodiment in that a trench is formed in the nitride semiconductor layer before the first ion implantation, the second ion implantation, and the third ion implantation, a gate insulating layer is formed in the trench after the second heat treatment, a gate electrode is formed in the trench after the gate insulating layer is formed, and the first ion implantation, the second ion implantation, and the third ion implantation are performed on a bottom face of the trench. Further, the manufacturing method of semiconductor devices according to the fourth embodiment is different in that a metal layer is formed on the surface of the nitride semiconductor layer after the second heat treatment. Hereinafter, a part of the description overlapping the first embodiment is omitted.

Figure 16:
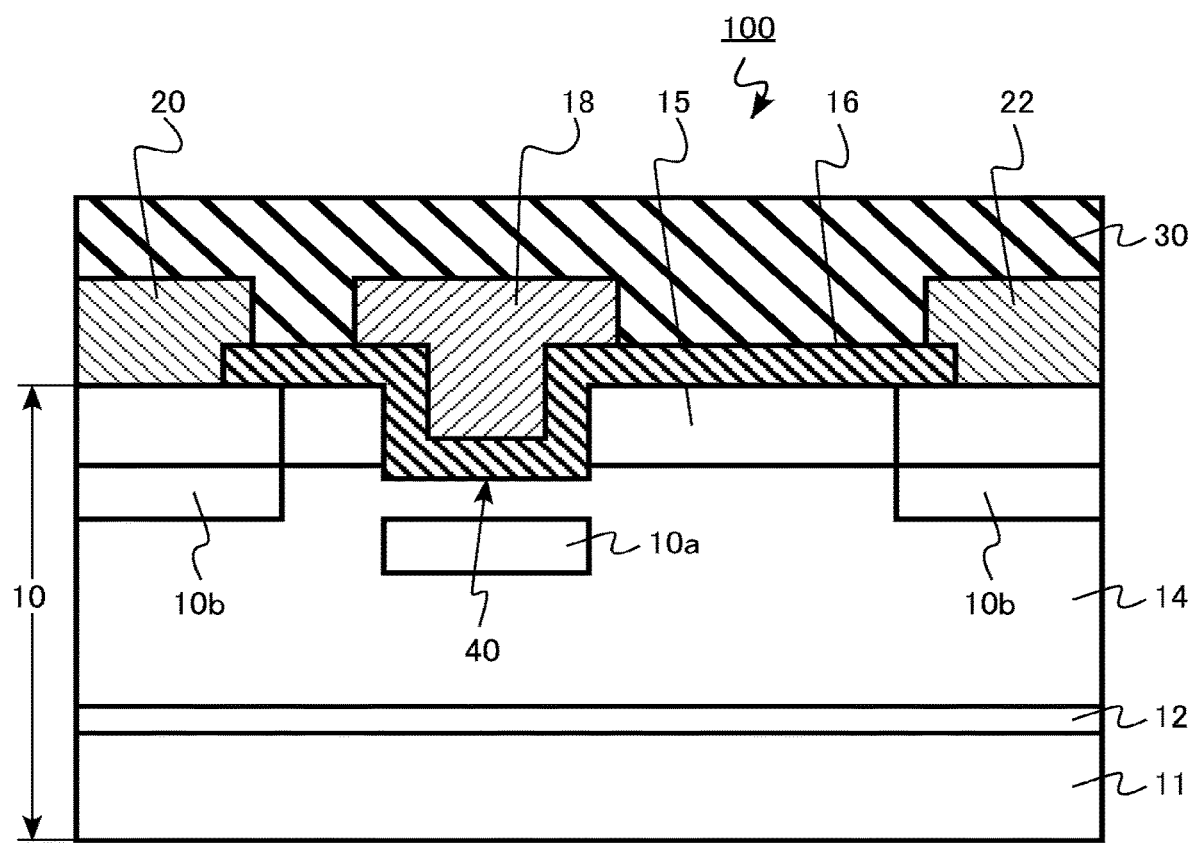
FIG. 16 is a schematic cross-sectional view of a semiconductor device manufactured by a manufacturing method of semiconductor devices according to a fourth embodiment.

FIG. 16 is a schematic cross-sectional view of a semiconductor device manufactured by the manufacturing method of semiconductor devices according to the fourth embodiment. The semiconductor device is a high electron mobility transistor (HEMT) 100 having a metal insulator semiconductor (MIS) structure using a GaN-based semiconductor. The HEMT 100 has a gate/recess structure in which a gate electrode is provided in a trench (recess).

The HEMT 100 includes the nitride semiconductor layer 10, a gate insulating layer 16, a gate electrode 18, a source electrode 20 (metal layer), a drain electrode 22 (metal layer), and an interlayer insulating layer 30.

The nitride semiconductor layer 10 includes the impurity region 10a, an impurity region 10b, a substrate 11, a buffer layer 12, a channel layer 14, a barrier layer 15, and a trench 40. The impurity region 10a is a p-type impurity region, and the impurity region 10b is an n-type impurity region.

The substrate 11 is made of, for example, silicon (Si). In addition to silicon, for example, sapphire ($Al_2O_3$) or silicon carbide (SiC) can be applied.

The buffer layer 12 is provided on the substrate 11. The buffer layer 12 includes a function of relaxing lattice mismatch between the substrate 11 and the channel layer 14. The buffer layer 12 is formed of, for example, a multilayer structure of aluminum gallium nitride ($Al_WGa_{1-W}N$ ($0<W\leq 1$)).

The channel layer 14 is provided on the buffer layer 12. The channel layer 14 is also called an electron transit layer. The channel layer 14 is, for example, undoped aluminum gallium nitride ($Al_XGa_{1-X}N$ ($0\leq X<1$)). More specifically, the channel layer is undoped gallium nitride (GaN), for example. The film thickness of the channel layer 14 is, for example, equal to or more than 0.1 μm and equal to or less than 10 μm.

The barrier layer 15 is provided on the channel layer 14. The barrier layer 15 is also called an electron supply layer. The bandgap of the barrier layer 15 is wider than the bandgap of the channel layer 14. The barrier layer 15 is, for example, undoped aluminum gallium nitride ($Al_YGa_{1-Y}N$ ($0<Y\leq 1$, $X<Y$)). More specifically, the barrier layer is undoped $Al_{0.25}Ga_{0.75}N$, for example. The film thickness of the barrier layer 15 is, for example, equal to or more than 10 nm and equal to or less than 100 nm.

A heterojunction interface is formed between the channel layer 14 and the barrier layer 15. A two-dimensional electron gas (2DEG) is formed at the heterojunction interface and becomes a carrier of the HEMT 100.

The source electrode 20 is provided on the channel layer 14 and the barrier layer 15. The source electrode 20 is electrically connected to the channel layer 14 and the barrier layer 15. The source electrode 20 is provided on the surface of the barrier layer 15, for example.

The source electrode 20 is, for example, a metal electrode. The source electrode 20 has, for example, a stacked structure of titanium (Ti) and aluminum (Al). It is desirable that the source electrode 20 and the barrier layer 15 be in ohmic contact.

The drain electrode 22 is provided on the channel layer 14 and the barrier layer 15. The drain electrode 22 is electrically connected to the channel layer 14 and the barrier layer 15. The drain electrode 22 is provided on the surface of the barrier layer 15, for example.

The drain electrode 22 is, for example, a metal electrode. The drain electrode 22 has, for example, a stacked structure of titanium (Ti) and aluminum (Al). It is desirable that the drain electrode 22 and the barrier layer 15 be in ohmic contact.

The distance between the source electrode 20 and the drain electrode 22 is, for example, equal to or more than 5 μm and equal to or less than 30 μm.

Incidentally, the source electrode 20 and the drain electrode 22 may be formed in contact with the channel layer 14.

The trench 40 is provided between the source electrode 20 and the drain electrode 22.

At least a part of the gate electrode 18 is formed in the trench 40. The gate electrode 18 is provided on the barrier layer 15. The gate electrode 18 is provided between the source electrode 20 and the drain electrode 22.

The gate electrode 18 is, for example, polycrystalline silicon containing conductive impurities. Further, the gate electrode 18 is, for example, metal. The gate electrode 18 is, for example, titanium nitride (TiN).

At least a part of the gate insulating layer 16 is formed in the trench 40. The gate insulating layer 16 is disposed between the channel layer 14 and the gate electrode 18. The gate insulating layer 16 is disposed between the bottom face of the trench 40 and the gate electrode 18, and between the side face of the trench 40 and the gate electrode 18.

The gate insulating layer 16 is also formed on the barrier layer 15 between the gate electrode 18 and the drain electrode 22. The gate insulating layer 16 is also formed on the barrier layer 15 between the gate electrode 18 and the source electrode 20.

The gate insulating layer 16 is, for example, an oxide or an oxynitride. The gate insulating layer 16 is, for example, silicon oxide, aluminum oxide, silicon oxynitride, or aluminum oxynitride.

The thickness of the gate insulating layer 16 is, for example, equal to or more than 20 nm and equal to or less than 100 nm. The equivalent silicon oxide film thickness (EOT: Equivalent Oxide Thickness) of the gate insulating layer 16 is, for example, equal to or more than 20 nm and equal to or less than 40 nm.

The bottom face of the trench 40 is disposed in the channel layer 14. The gate insulating layer 16 and the gate electrode 18 are formed in the trench 40. When the bottom face of the trench 40 is disposed in the channel layer 14, the two-dimensional electron gas below the gate electrode 18 is extinguished. Therefore, the normally-off operation can be realized.

The impurity region 10a is disposed in the channel layer 14 below the trench 40. The impurity region 10a contains at least one p-type impurity selected from the group consisting of beryllium (Be), magnesium (Mg), calcium (Ca), strontium (Sr), barium (Ba), zinc (Zn), and cadmium (Cd). The impurity region 10a is a p-type impurity region.

The p-type impurity concentration of the impurity region 10a is, for example, equal to or more than $1\times10^{16}$ cm$^{-3}$ and equal to or less than $1\times10^{19}$ cm$^{-3}$.

The impurity region 10a raises the potential of the channel layer 14 between the trench 40 and the impurity region 10a. The impurity region 10a has a function of increasing the threshold voltage of the HEMT 100.

The impurity region 10b is provided in the channel layer 14 and the barrier layer 15 immediately below the source electrode 20 and immediately below the drain electrode 22. The source electrode 20 and the drain electrode 22 are in contact with the impurity region 10b. The impurity region 10b contains at least one n-type impurity selected from the group consisting of silicon (Si), germanium (Ge), and tin (Sn). The impurity region 10b is an n-type impurity region.

The n-type impurity concentration of the impurity region 10b is, for example, equal to or more than $1 \times 10^{19}$ cm$^{-3}$ and equal to or less than $1 \times 10^{22}$ cm$^{-3}$.

The impurity region 10b contains activated high-concentration n-type impurities. Therefore, the impurity region 10b has a function of reducing the contact resistance of the source electrode 20 and the drain electrode 22 and realizing ohmic contact.

Figure 17:
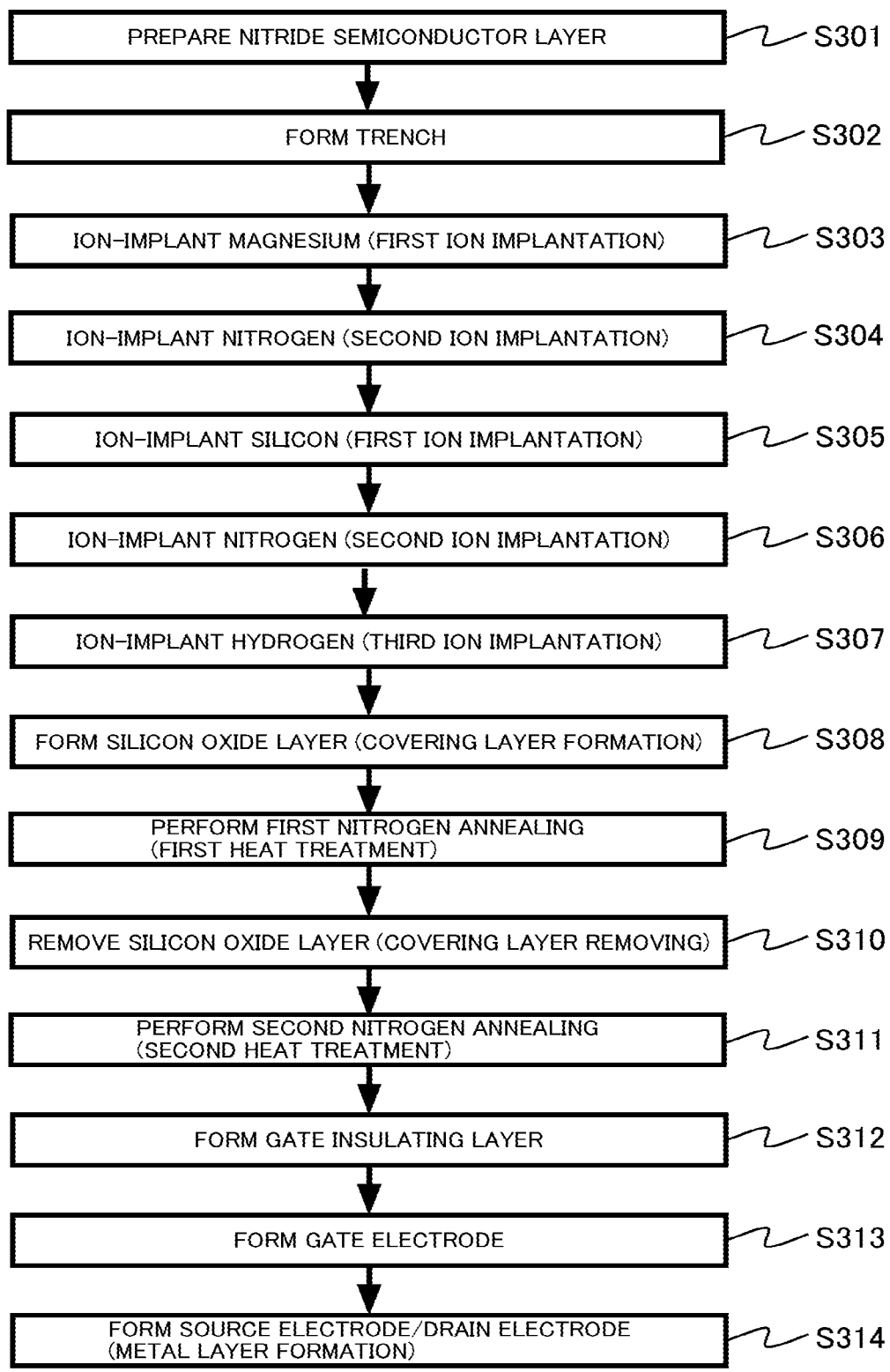
FIG. 17 is a diagram illustrating a manufacturing flow of the manufacturing method of semiconductor devices according to the fourth embodiment.

FIG. 17 is a diagram illustrating a manufacturing flow of the manufacturing method of semiconductor devices according to the fourth embodiment.

FIGS. 18, 19, 20, 21, 22, 23, 24, 25, 26, 27, 28, 29, 30, and 31 are cross-sectional views illustrating the manufacturing method of semiconductor devices according to the fourth embodiment.

The manufacturing method of semiconductor devices according to the fourth embodiment includes nitride semiconductor layer preparation step S301, trench formation step S302, magnesium ion implantation step S303 (first ion implantation), nitrogen ion implantation step S304 (second ion implantation), silicon ion implantation step S305 (first ion implantation), nitrogen ion implantation step S306 (second ion implantation), hydrogen ion implantation step S307 (third ion implantation), silicon oxide layer formation step S308 (covering layer formation), first nitrogen annealing step S309 (first heat treatment), silicon oxide layer removing step S310 (covering layer removing), second nitrogen annealing step S311 (second heat treatment), gate insulating layer formation step S312, gate electrode formation step S313, and source electrode/drain electrode formation step S314 (metal layer formation).

Figure 18:
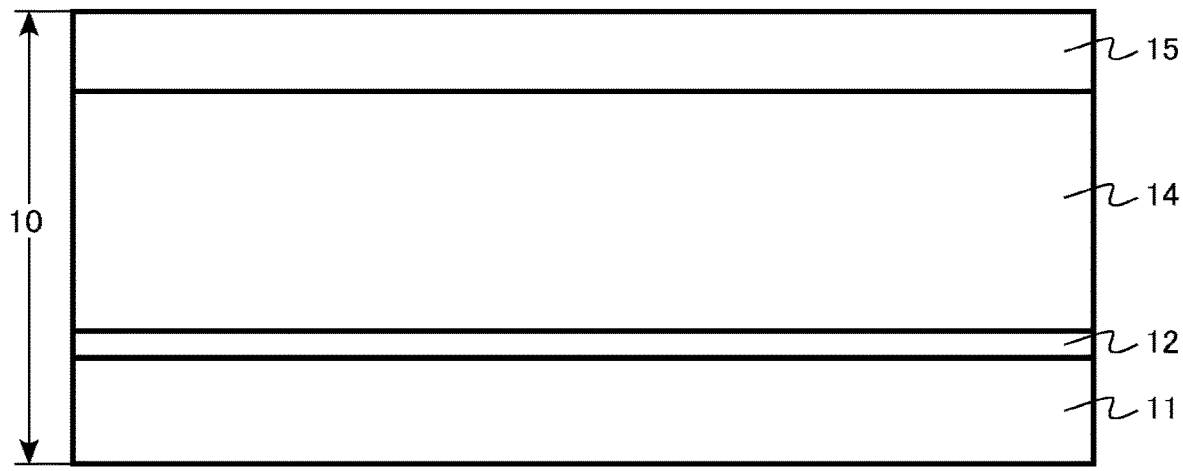
FIG. 18 is a cross-sectional view illustrating the manufacturing method of semiconductor devices according to the fourth embodiment.

First, the nitride semiconductor layer 10 is prepared (S301: FIG. 18). The nitride semiconductor layer 10 has the substrate 11, the buffer layer 12, the channel layer 14, and the barrier layer 15.

Next, a mask material 52 is formed on the surface of the nitride semiconductor layer 10 by using a known film growth method. For example, the mask material 52 is silicon oxide.

Figure 19:
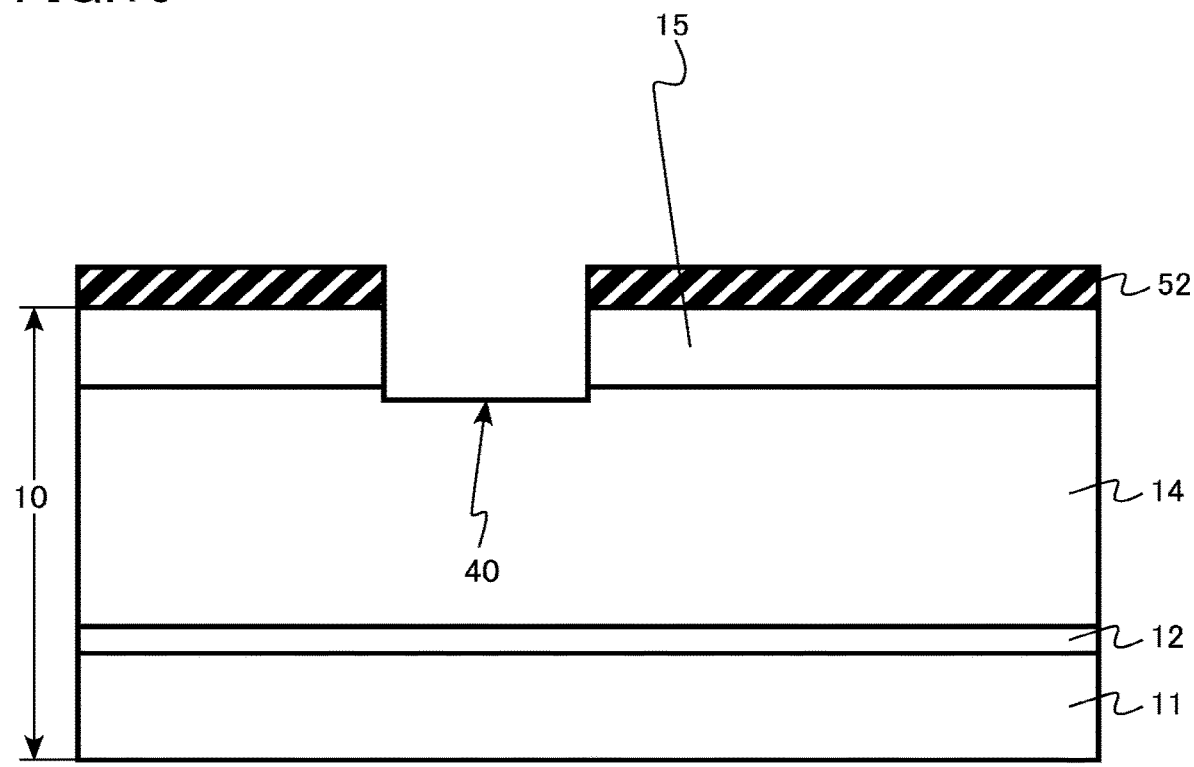
FIG. 19 is a cross-sectional view illustrating the manufacturing method of semiconductor devices according to the fourth embodiment.

Next, the mask material 52 is patterned by using a known lithography method and dry etching method. Next, with the mask material 52 as a mask, the trench 40 is formed by using a known dry etching method (S302: FIG. 19).

Figure 20:
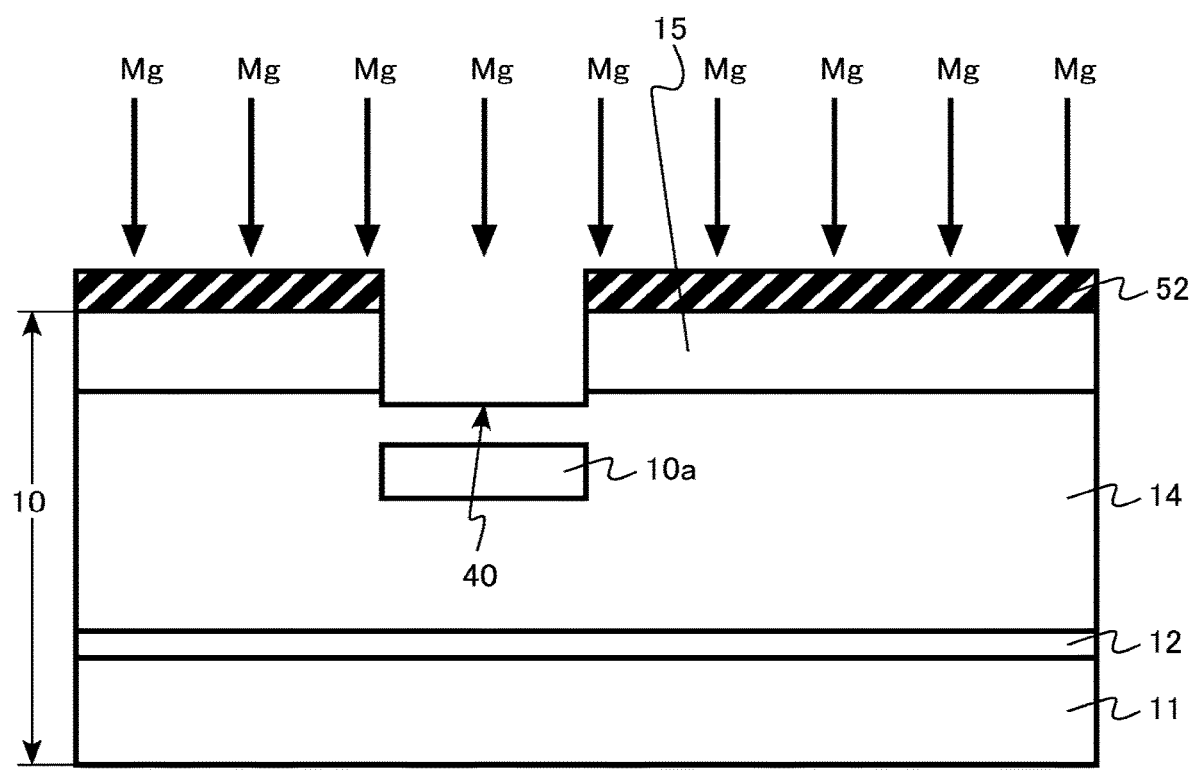
FIG. 20 is a cross-sectional view illustrating the manufacturing method of semiconductor devices according to the fourth embodiment.

Next, with the mask material 52 as a mask, magnesium (Mg) is ion-implanted into the bottom face of the trench 40 by using a known ion implantation method (S303: FIG. 20). The magnesium ion implantation corresponds to the first ion implantation. The element to be implanted by the first ion implantation is not limited to magnesium (Mg) and may be at least one element (conductive impurity) selected from the group consisting of beryllium (Be), magnesium (Mg), calcium (Ca), strontium (Sr), barium (Ba), zinc (Zn), and cadmium (Cd).

The impurity region 10a is formed in the channel layer 14 below the trench 40 by ion-implanting magnesium. For example, magnesium may be ion-implanted multiple times with different ion-implantation energies.

The dose amount of magnesium is, for example, equal to or more than $1 \times 10^{11}$ cm$^{-2}$ and equal to or less than $1 \times 10^{15}$ cm$^{-2}$.

Figure 21:
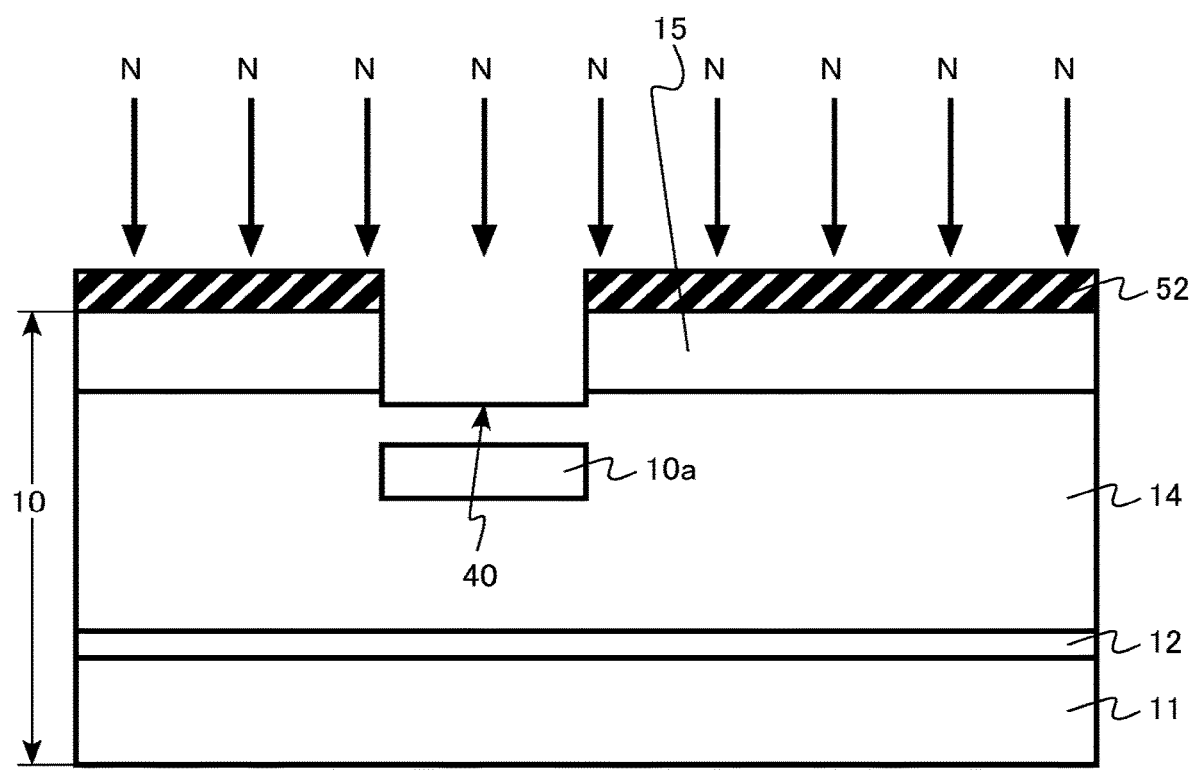
FIG. 21 is a cross-sectional view illustrating the manufacturing method of semiconductor devices according to the fourth embodiment.

Next, with the mask material 52 as a mask, nitrogen (N) is ion-implanted into the bottom face of the trench 40 by using a known ion implantation method (S304: FIG. 21). The nitrogen ion implantation corresponds to the second ion implantation.

Nitrogen is introduced into the impurity region 10a. For example, nitrogen may be ion-implanted multiple times with different ion-implantation energies.

The dose amount of nitrogen is larger than the dose amount of magnesium, for example. The dose amount of nitrogen is, for example, equal to or more than $1 \times 10^{11}$ cm$^{-2}$ and equal to or less than $1 \times 10^{15}$ cm$^{-2}$. It is preferable that the dose amount of nitrogen be larger than the dose amount of magnesium at each ion-implanted position.

It is preferable that the concentration distribution of nitrogen include the concentration distribution of magnesium.

Next, the mask material 52 is removed by using a known etching method. Next, a patterned mask material 54 which covers the trench 40 is formed by using, for example, a known lithography method. The mask material 54 is, for example, a photoresist.

Figure 22:
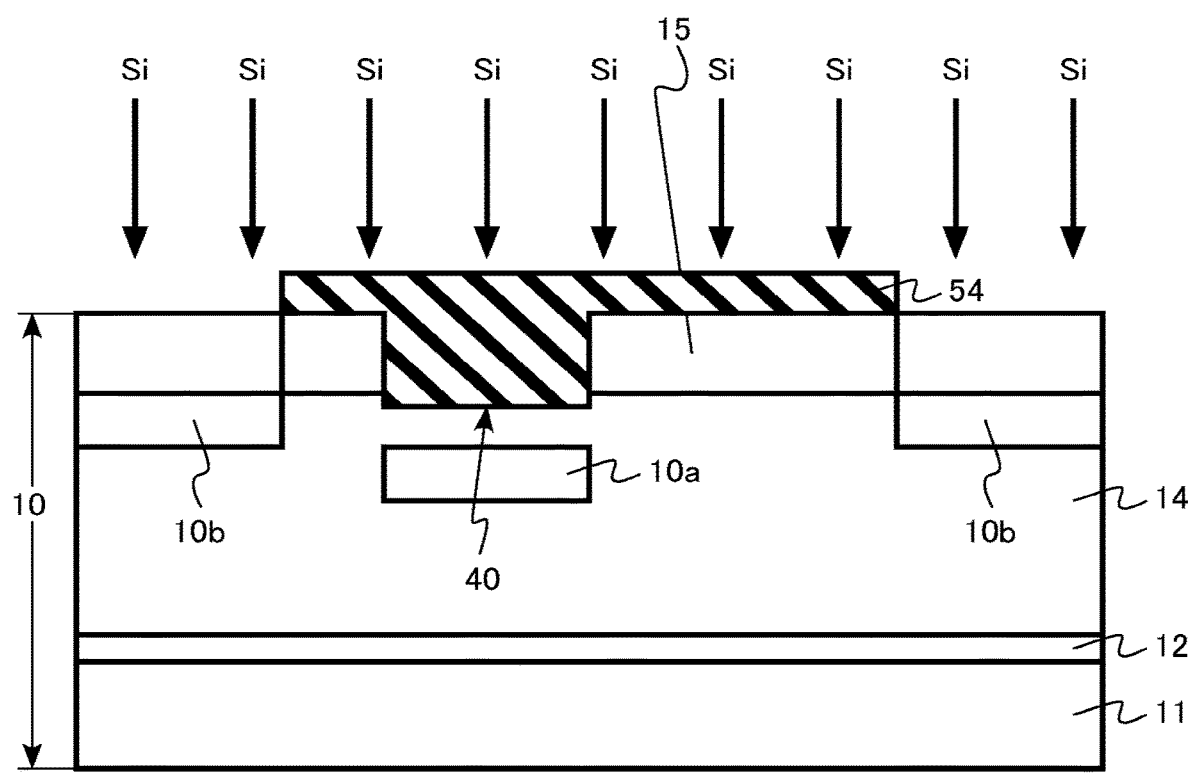
FIG. 22 is a cross-sectional view illustrating the manufacturing method of semiconductor devices according to the fourth embodiment.

Next, with the mask material 54 as a mask, silicon (Si) is ion-implanted into the surface of the nitride semiconductor layer 10 by a known ion implantation method (S305: FIG. 22). The ion implantation of silicon corresponds to the first ion implantation. The element to be implanted by the first ion implantation is not limited to silicon (Si) and may be at least one element (conductive impurity) selected from the group consisting of silicon (Si), germanium (Ge), and tin (Sn).

The impurity region 10b is formed in the channel layer 14 and the barrier layer 15 by ion-implanting silicon. For example, silicon may be ion-implanted multiple times with different ion-implantation energies.

The dose amount of silicon is, for example, equal to or more than $1 \times 10^{11}$ cm$^{-2}$ and equal to or less than $1 \times 10^{15}$ cm$^{-2}$.

Figure 23:
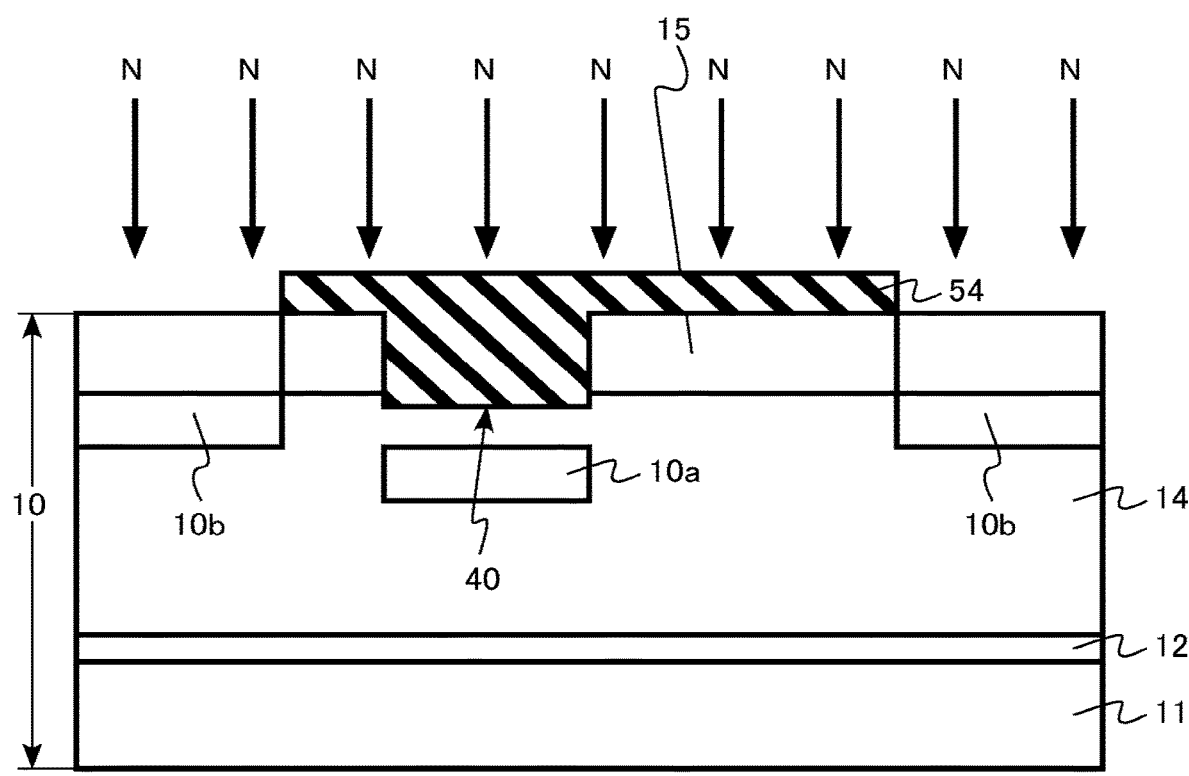
FIG. 23 is a cross-sectional view illustrating the manufacturing method of semiconductor devices according to the fourth embodiment.

Next, with the mask material 54 as a mask, nitrogen (N) is ion-implanted into the surface of the nitride semiconductor layer 10 by a known ion implantation method (S306: FIG. 23). The nitrogen ion implantation corresponds to the second ion implantation.

Nitrogen is introduced into the impurity region 10b. For example, nitrogen may be ion-implanted multiple times with different ion-implantation energies.

The dose amount of nitrogen is larger than the dose amount of silicon, for example. The dose amount of nitrogen is, for example, equal to or more than $1 \times 10^{11}$ cm$^{-2}$ and equal to or less than $1 \times 10^{15}$ cm$^{-2}$. It is preferable that the dose amount of nitrogen be larger than the dose amount of silicon at each ion-implanted position. It is preferable that the concentration distribution of nitrogen include the concentration distribution of silicon.

Figure 24:
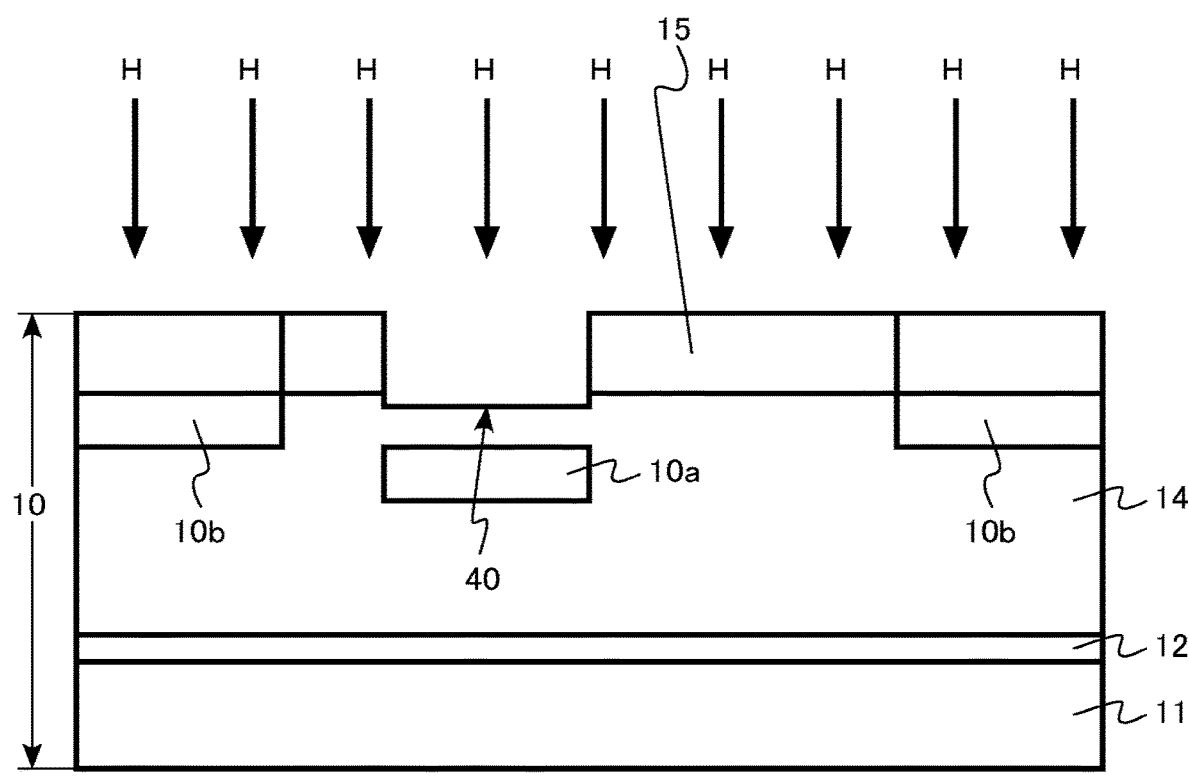
FIG. 24 is a cross-sectional view illustrating the manufacturing method of semiconductor devices according to the fourth embodiment.

Next, the mask material 52 is removed by using a known etching method. Next, hydrogen (H) is ion-implanted into the surface of the nitride semiconductor layer 10 by using a known ion implantation method (S307: FIG. 24). The hydrogen Ion implantation corresponds to the third ion implantation.

Hydrogen is introduced into the impurity region 10a and the impurity region 10b. For example, hydrogen may be ion-implanted multiple times with different ion-implantation energies.

The dose amount of hydrogen in the third ion implantation is larger than the dose amount of magnesium in the first ion implantation, for example. It is preferable that the dose amount of hydrogen in the third ion implantation be larger than the dose amount of magnesium at each ion-implanted position. It is preferable that the concentration distribution of hydrogen formed by the third ion implantation include the concentration distribution of magnesium formed by the first ion implantation.

The dose amount of hydrogen in the third ion implantation is larger than the dose amount of silicon in the first ion implantation, for example. It is preferable that the dose amount of hydrogen in the third ion implantation be larger than the dose amount of silicon at each ion-implanted position. It is preferable that the concentration distribution of hydrogen formed by the third ion implantation include the concentration distribution of silicon formed by the first ion implantation.

The dose amount of hydrogen is, for example, equal to or more than $1\times10^{15}$ cm$^{-2}$ and equal to or less than $1\times10^{16}$ cm$^{-2}$.

Figure 25:
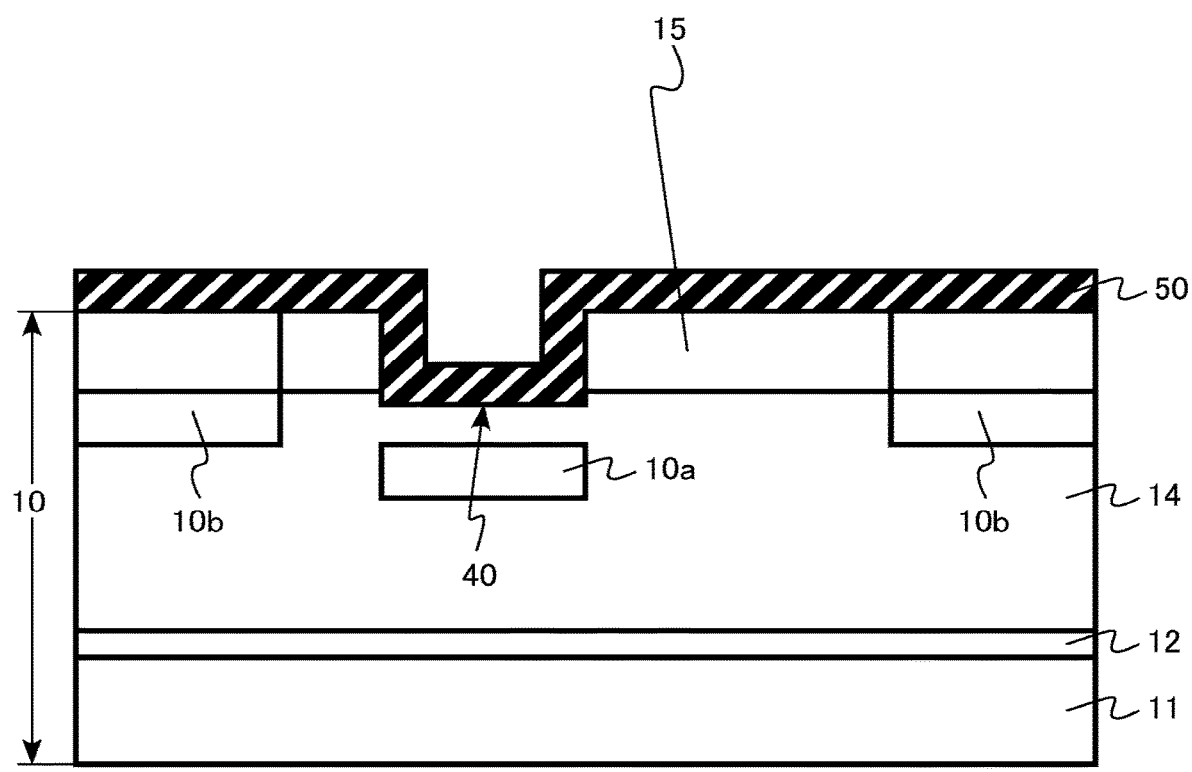
FIG. 25 is a cross-sectional view illustrating the manufacturing method of semiconductor devices according to the fourth embodiment.

Next, a silicon oxide layer 50 is formed on the surface of the nitride semiconductor layer 10 by using a known film growth method (S308: FIG. 25). The silicon oxide layer 50 is an example of a covering layer. The covering layer is not limited to silicon oxide.

The covering layer is, for example, an insulator. The covering layer is, for example, silicon oxide, silicon nitride, silicon oxynitride, or aluminum nitride.

The covering layer is, for example, a conductor or a semiconductor. The covering layer is, for example, polycrystalline silicon.

Figure 26:
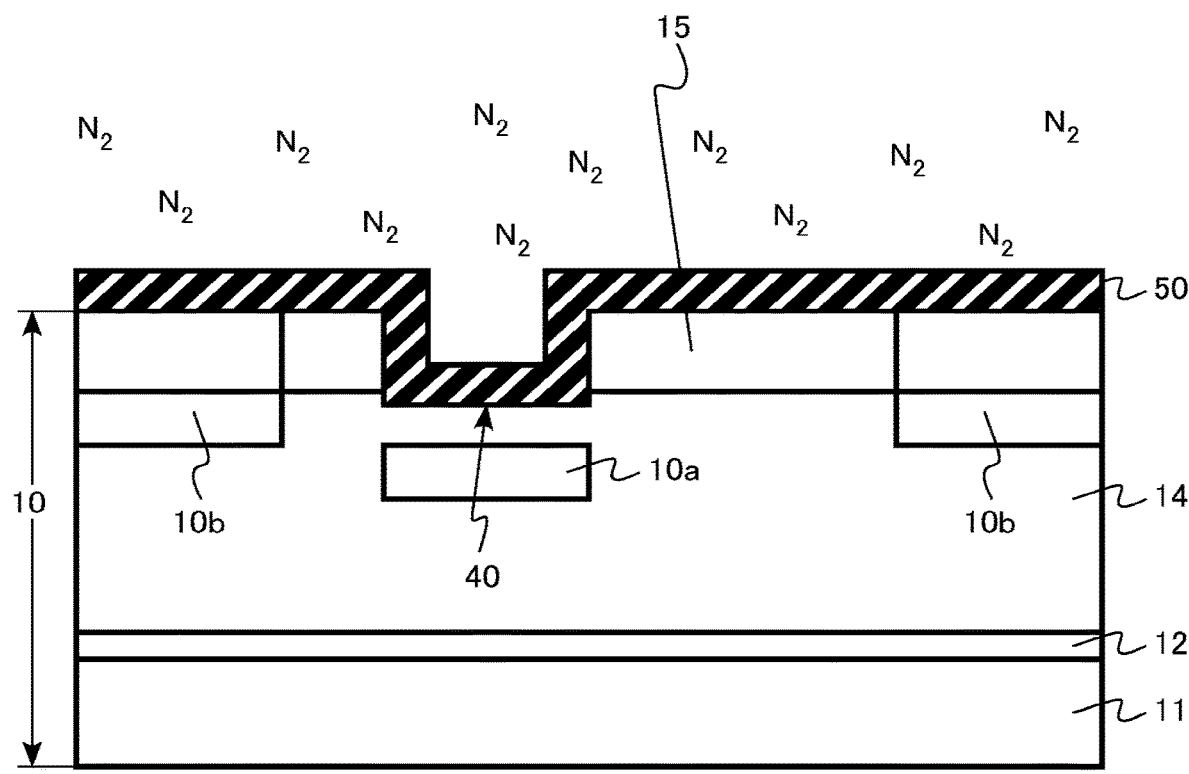
FIG. 26 is a cross-sectional view illustrating the manufacturing method of semiconductor devices according to the fourth embodiment.

Next, the first nitrogen annealing is performed (S309: FIG. 26). The first nitrogen annealing is performed, for example, in a nitrogen gas atmosphere under a temperature condition of 950° C. or higher and 1250° C. or lower. The first nitrogen annealing is an example of the first heat treatment.

The first heat treatment is performed in a non-oxidizing atmosphere containing argon, nitrogen, hydrogen, or helium, for example.

Figure 27:
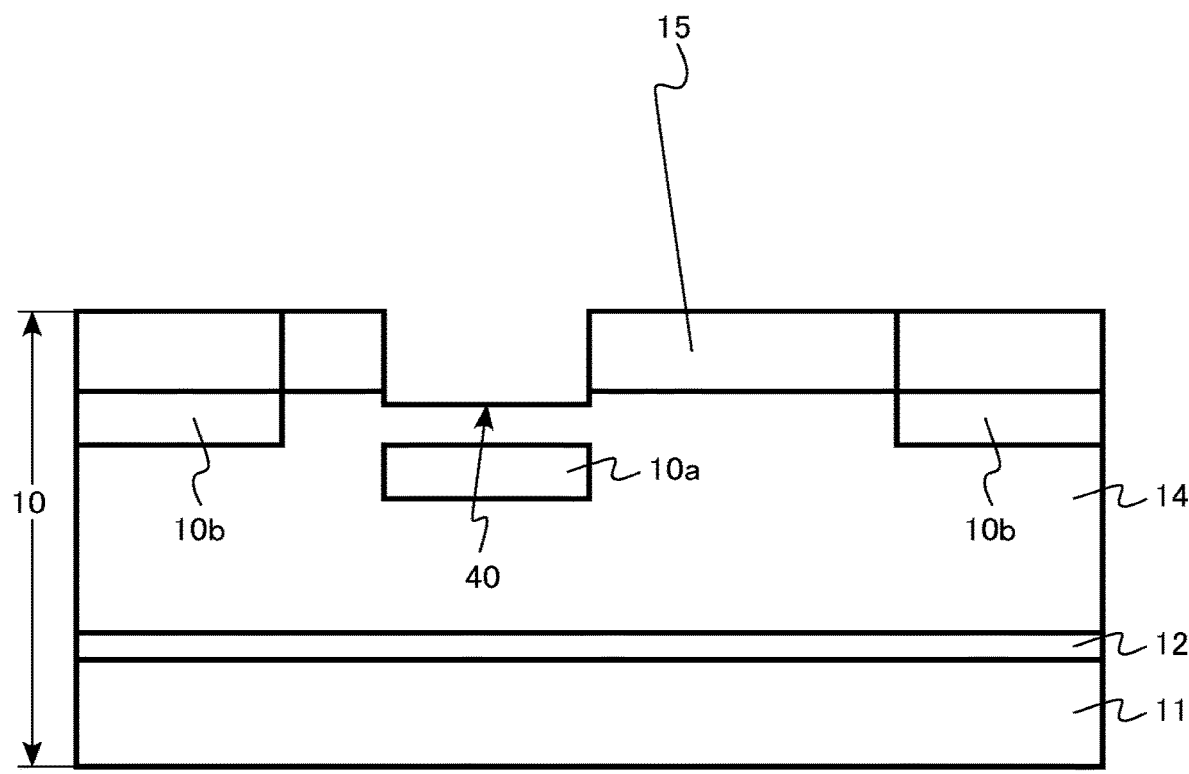
FIG. 27 is a cross-sectional view illustrating the manufacturing method of semiconductor devices according to the fourth embodiment.

Next, the silicon oxide layer 50 on the surface of the nitride semiconductor layer 10 is removed by using a known wet etching method (S310: FIG. 27). The surface of the nitride semiconductor layer 10 is exposed.

Figure 28:
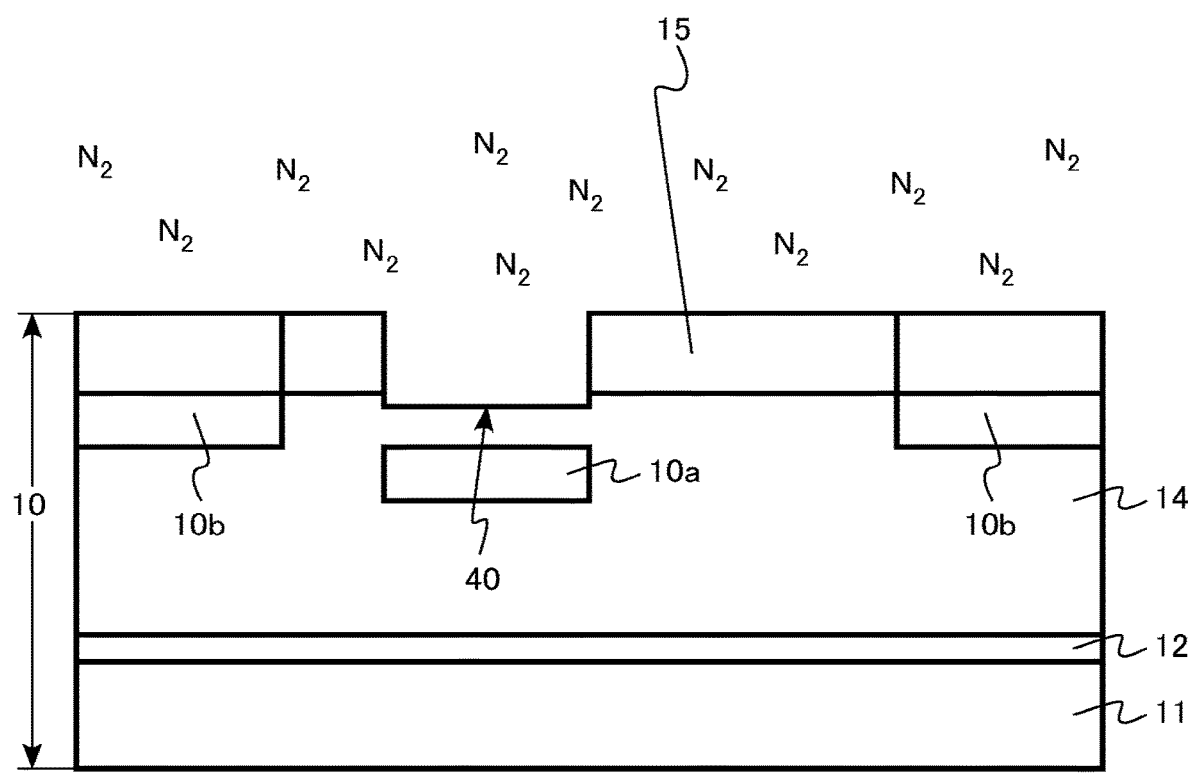
FIG. 28 is a cross-sectional view illustrating the manufacturing method of semiconductor devices according to the fourth embodiment.

Next, the second nitrogen annealing is performed (S311: FIG. 28). The second nitrogen annealing is performed, for example, in a nitrogen gas atmosphere under a temperature condition of 950° C. or higher and 1250° C. or lower. The second nitrogen annealing is an example of the second heat treatment.

The second heat treatment is performed in a non-oxidizing atmosphere containing argon, nitrogen, or helium, for example. The second heat treatment is performed, for example, in an atmosphere containing no hydrogen.

Figure 29:
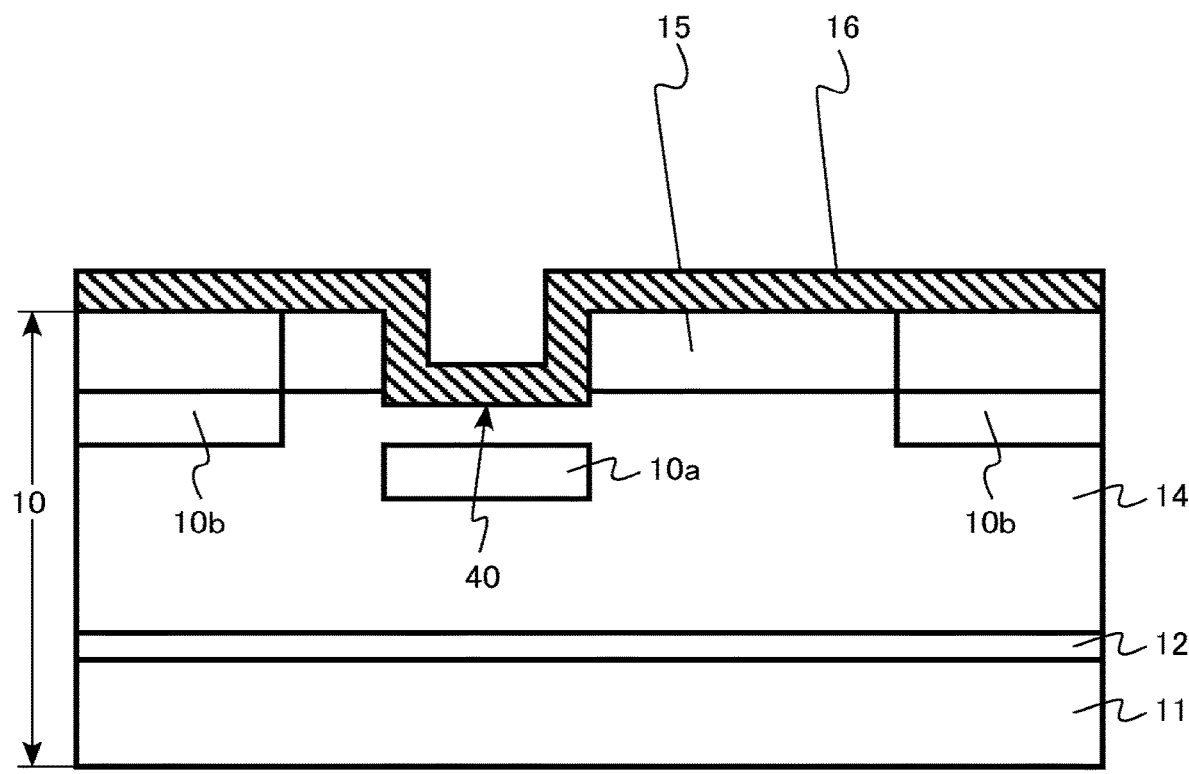
FIG. 29 is a cross-sectional view illustrating the manufacturing method of semiconductor devices according to the fourth embodiment.

Next, the gate insulating layer 16 is formed by using a known film growth method (S312: FIG. 29). The gate insulating layer 16 is formed in the trench 40.

Figure 30:
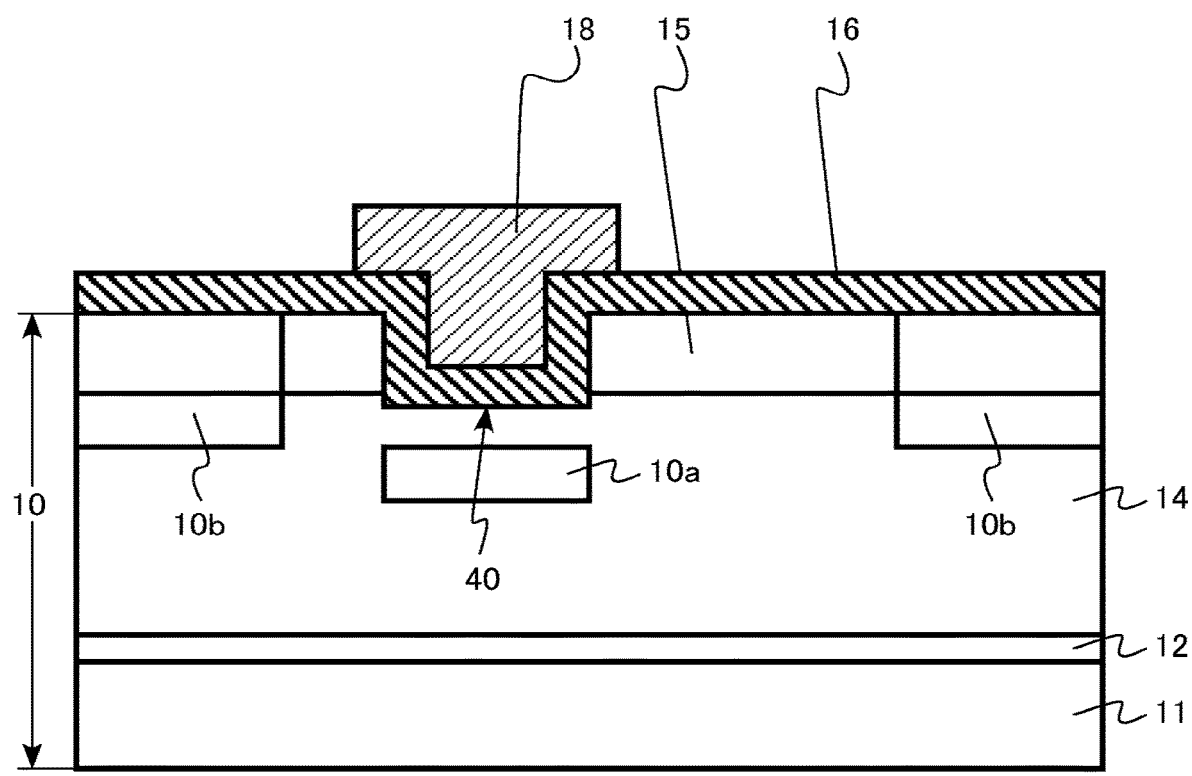
FIG. 30 is a cross-sectional view illustrating the manufacturing method of semiconductor devices according to the fourth embodiment.

Next, the gate electrode 18 is formed by using a known film growth method, lithography method, and dry etching method (S313: FIG. 30). The gate electrode 18 is formed in the trench 40.

Figure 31:
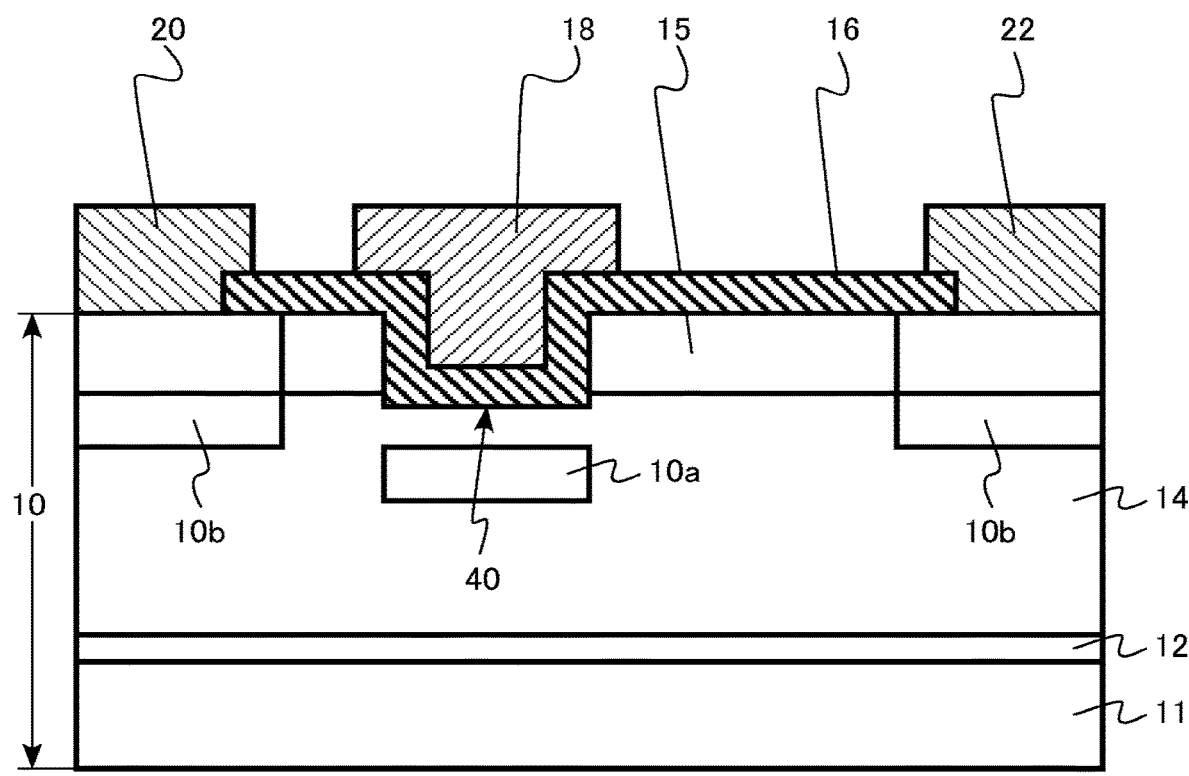
FIG. 31 is a cross-sectional view illustrating the manufacturing method of semiconductor devices according to the fourth embodiment.

Next, the source electrode 20 and the drain electrode 22 are formed by using a known film growth method (S314: FIG. 31). The source electrode 20 and the drain electrode 22 are examples of metal layers. Next, the interlayer insulating layer 30 is formed on the gate electrode 18, the source electrode 20, and the drain electrode 22 by using a known film growth method.

The HEMT 100 having the impurity region 10a and the impurity region 10b is formed by the above manufacturing method. The impurity region 10a becomes a p-type impurity region in which magnesium is activated. The impurity region 10b becomes an n-type impurity region in which silicon is activated.

As described above, in the manufacturing method of semiconductor devices according to the fourth embodiment, as in the first embodiment, it is possible to provide a manufacturing method of semiconductor devices in which a low-resistance impurity region is locally formed in a nitride semiconductor by using an ion implantation method.

Fifth Embodiment

A semiconductor device according to a fifth embodiment includes: a first nitride semiconductor layer; a second nitride semiconductor layer disposed on the first nitride semiconductor layer, the second nitride semiconductor layer having a bandgap wider than a bandgap of the first nitride semiconductor layer; a first electrode disposed on the second nitride semiconductor layer, the first electrode being electrically connected to the second nitride semiconductor layer; a second electrode disposed on the second nitride semiconductor layer, the second electrode being electrically connected to the second nitride semiconductor layer; a trench disposed between the first electrode and the second electrode, the trench having a first side face, a second side face, and a bottom face between the first side face and the second side face, the trench having the first side face and the second side face inclined with respect to the bottom face, and the trench having the bottom face disposed in the first nitride semiconductor layer; a gate electrode disposed in the trench; a gate insulating layer disposed between the bottom face and the gate electrode and between the first side face and the second side face and the gate electrode; and a third nitride semiconductor layer disposed between the bottom face and the gate insulating layer and between the first side face and the second side face and the gate insulating layer, the third nitride semiconductor layer having a bandgap wider than the bandgaps of the first nitride semiconductor layer and the second nitride semiconductor layer. The first nitride semiconductor layer includes, on a lateral side of at least one of the first side face and the second side face, a first region containing at least one element selected from a group consisting of beryllium (Be), magnesium (Mg), calcium (Ca), strontium (Sr), barium (Ba), zinc (Zn), and cadmium (Cd).

The semiconductor device according to the fifth embodiment is different from the semiconductor device according to the fourth embodiment in that the semiconductor device includes the third nitride semiconductor layer and the first region. Hereinafter, the description overlapping the first to fourth embodiments is omitted.

Figure 32:
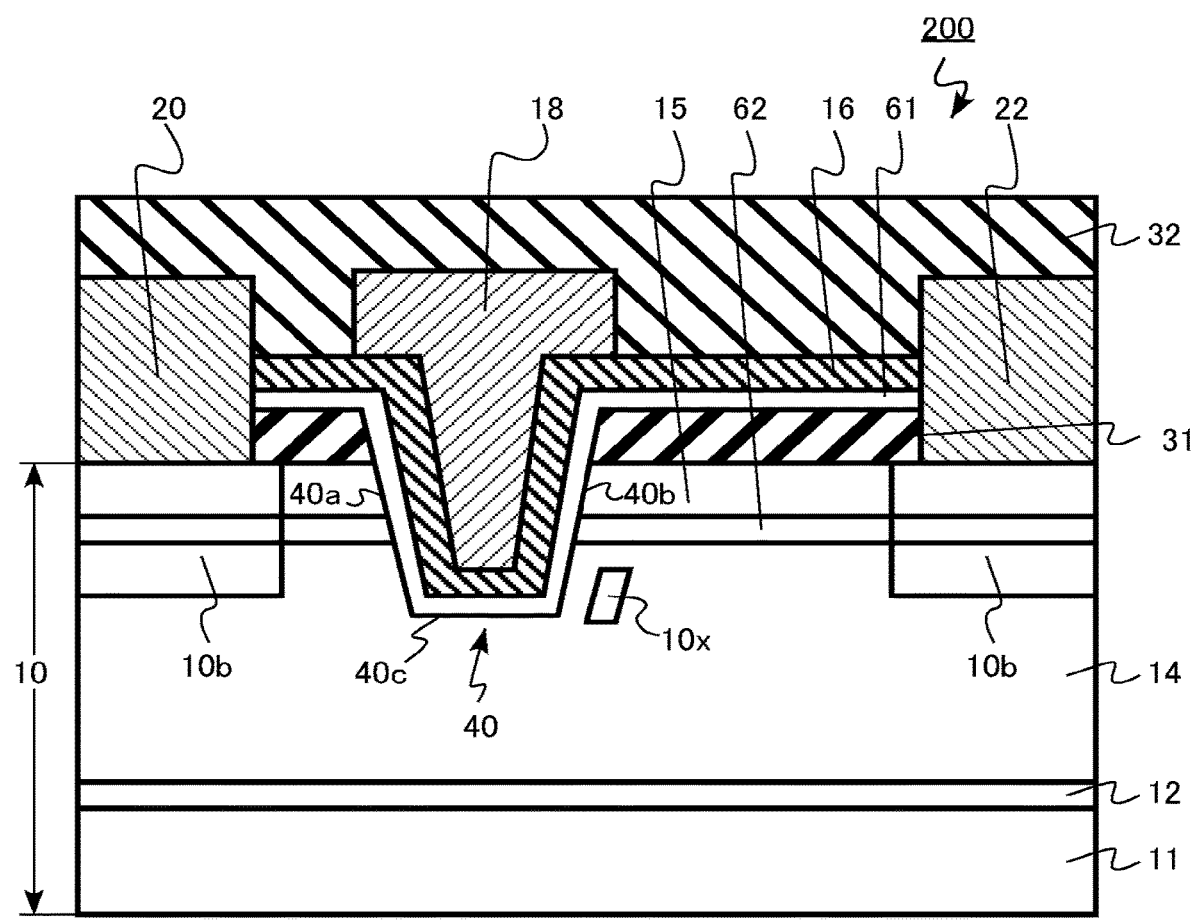
FIG. 32 is a schematic cross-sectional view of a semiconductor device according to a fifth embodiment.

FIG. 32 is a schematic cross-sectional view of the semiconductor device according to the fifth embodiment. The semiconductor device is a HEMT 200 having a MIS structure using a GaN-based semiconductor. The HEMT 200 has a gate/recess structure in which a gate electrode is provided in a trench (recess).

The HEMT 200 includes the nitride semiconductor layer 10, the gate insulating layer 16, the gate electrode 18, the source electrode 20 (first electrode), the drain electrode 22 (second electrode), a first interlayer insulating layer 31, a second interlayer insulating layer 32, and a first aluminum nitride layer 61 (third nitride semiconductor layer).

The nitride semiconductor layer 10 includes the impurity region 10b, an impurity region 10x, the substrate 11, the buffer layer 12, the channel layer 14 (first nitride semiconductor layer), the barrier layer 15 (second nitride semiconductor layer), the trench 40, and a second aluminum nitride layer 62 (fourth nitride semiconductor layer). The impurity region 10b (second region) is an n-type impurity region, and the impurity region 10x (first region) is a p-type impurity region. The trench 40 has a first side face 40a, a second side face 40b, and a bottom face 40c.

The substrate 11 is made of, for example, silicon (Si). In addition to silicon, for example, sapphire ($Al_2O_3$) or silicon carbide (SiC) can be applied.

The buffer layer 12 is provided on the substrate 11. The buffer layer 12 includes a function of relaxing lattice mismatch between the substrate 11 and the channel layer 14. The buffer layer 12 is formed of, for example, a multilayer structure of aluminum gallium nitride ($Al_WGa_{1-W}N$ ($0<W\leq1$)).

The channel layer 14 is provided on the buffer layer 12. The channel layer 14 is also called an electron transit layer. The channel layer 14 is, for example, undoped aluminum gallium nitride ($Al_XGa_{1-X}N$ ($0\leq X<1$)). More specifically, the channel layer is undoped gallium nitride (GaN), for example. The film thickness of the channel layer 14 is, for example, equal to or more than 0.1 µm and equal to or less than 10 µm.

The barrier layer 15 is provided on the channel layer 14. The barrier layer 15 is also called an electron supply layer. The bandgap of the barrier layer 15 is wider than the bandgap of the channel layer 14. The barrier layer 15 is, for example, undoped aluminum gallium nitride ($Al_YGa_{1-Y}N$ ($0<Y\leq1$, $X<Y$)). More specifically, the barrier layer is undoped $Al_{0.25}Ga_{0.75}N$, for example. The film thickness of the barrier layer 15 is, for example, equal to or more than 10 nm and equal to or less than 100 nm.

The second aluminum nitride layer 62 is provided between the channel layer 14 and the barrier layer 15. The bandgap of the second aluminum nitride layer 62 is wider than the bandgap of the channel layer 14 and the bandgap of the barrier layer 15. The film thickness of the second aluminum nitride layer 62 is, for example, equal to or more than 0.5 nm and equal to or less than 30 nm.

A heterojunction interface is formed between the second aluminum nitride layer 62 and the channel layer 14. A two-dimensional electron gas (2DEG) is formed at the heterojunction interface and becomes a carrier of the HEMT 200. When the film thickness of the second aluminum nitride layer 62 increases, the amount of the 2DEG becomes larger, and thus it is preferable that the film thickness of the second aluminum nitride layer 62 be large. On the other hand, as the film thickness of the second aluminum nitride layer 62 increases, the barrier to the 2DEG increases, and thus it becomes difficult to make ohmic contact with the 2DEG. Therefore, for example, the second aluminum nitride layer 62 of about 0.5 nm to 3 nm can be introduced.

For example, according to the method of forming the n-type impurity region of the first to third embodiments, it is easy to make ohmic contact with the 2DEG when the film thickness of the second aluminum nitride layer 62 is large. Therefore, compared to the case of not using the method of forming the n-type impurity regions of the first to third embodiments, it is possible to apply the thicker second aluminum nitride layer 62.

The mechanism for making ohmic contact with the 2DEG easier by thickening the second aluminum nitride layer 62 is the following two points. The first point is that a local n-type impurity region is formed so as to include the second aluminum nitride layer 62. The second point is that when the thick second aluminum nitride layer 62 is introduced, a large amount of 2DEG is generated, and the 2DEG is generated even inside the local n-type impurity region including the second aluminum nitride layer 62. For the above two reasons, when the second aluminum nitride layer 62 is thick, it is easy is to make ohmic contact.

In a case where the method of forming the n-type impurity region of the first to third embodiments is not used, the film thickness of the second aluminum nitride layer 62 is preferably equal to or more than 0.5 nm and equal to or less than 3 nm. However, in a case where the method for forming the n-type impurity region of the first to third embodiments is used, the film thickness of the second aluminum nitride layer 62 is preferably equal to or more than 3 nm, more preferably equal to or more than 5 nm, and much more preferably equal to or more than 10 nm.

It is preferable that the film thickness of the second aluminum nitride layer 62 be thicker. However, when the film thickness of the second aluminum nitride layer 62 exceeds 10 nm, the epitaxial growth of the second aluminum nitride layer 62 gradually becomes difficult, and interface defects start to occur. When the thickness of the second aluminum nitride layer 62 exceeds 25 nm, the interfacial defects become prominent, and the breakdown voltage starts to decrease at 30 nm or more. Therefore, the film thickness of the second aluminum nitride layer 62 is preferably equal to or less than 30 nm.

From the above, the film thickness of the second aluminum nitride layer 62 is preferably equal to or more than 3 nm and equal to or less than 30 nm, more preferably equal to or more than 5 nm and equal to or less than 30 nm, and much more preferably equal to or more than 10 nm and equal to or less than 25 rm. The film thickness of the second aluminum nitride layer 62 is typically 10 nm.

In a case where the method of forming the n-type impurity region of the first to third embodiments is not used, the second aluminum nitride layer 62 having a film thickness of, for example, about 1 nm is introduced in order to realize a low-resistance element. In this case, for example, the second aluminum nitride layer 62 serves as a barrier which prevents contact with the 2DEG. Therefore, for example, the second aluminum nitride layer 62 is removed by etching, and the contact is made from the side face of the 2DEG. In this case, the contact face to the 2DEG becomes linear, and the contact area becomes small. Therefore, it is difficult to form a low-resistance contact.

When the method for forming the n-type impurity region of the first to third embodiments is used, it is possible to form the n-type impurity region in a form including the 2DEG formed by the second aluminum nitride layer 62. By this method, more electrons can be given to the 2DEG. Further, it is possible to form a contact in a planar shape on the entire 2DEG. As a result, even when the film thickness of the second aluminum nitride layer 62 is increased, the low-resistance contact can be obtained.

When the film thickness of the second aluminum nitride layer 62 is increased, the 2DEG amount can be increased, and the contact resistance is further reduced. Therefore, an element having a lower resistance is realized.

In a case where the method of forming the n-type impurity region of the first to third embodiments is not used, the realization of the low-resistance contact to the source/drain and the realization of the low-resistance element have a trade-off relationship. However, since the low-resistance contact can be obtained even when the film thickness of the aluminum nitride layer 62 is increased, the above trade-off relationship is resolved, and it becomes possible to simultaneously realize the low resistance-contact and the low-resistance element.

The second aluminum nitride layer 62 contains at least one element selected from the group consisting of silicon (Si), germanium (Ge), and tin (Sn).

The source electrode 20 is provided on the barrier layer 15. The source electrode 20 is electrically connected to the channel layer 14 and the barrier layer 15. The source electrode 20 is provided on the surface of the barrier layer 15, for example.

The source electrode 20 is, for example, a metal electrode. The source electrode 20 has, for example, a stacked structure of titanium (Ti) and aluminum (Al). It is desirable that the source electrode 20 and the barrier layer 15 be in ohmic contact.

The drain electrode 22 is provided on the barrier layer 15. The drain electrode 22 is electrically connected to the channel layer 14 and the barrier layer 15. The drain electrode 22 is provided on the surface of the barrier layer 15, for example.

The drain electrode 22 is, for example, a metal electrode. The drain electrode 22 has, for example, a stacked structure of titanium (Ti) and aluminum (Al). It is desirable that the drain electrode 22 and the barrier layer 15 be in ohmic contact.

The distance between the source electrode 20 and the drain electrode 22 is, for example, equal to or more than 5 μm and equal to or less than 30 μm.

The trench 40 is provided between the source electrode 20 and the drain electrode 22. The trench 40 has a first side face 40a, a second side face 40b, and a bottom face 40c. The bottom face 40c is disposed between the first side face 40a and the second side face 40b.

The first side face 40a and the second side face 40b are inclined with respect to the bottom face 40c. The first side face 40a and the second side face 40b are inclined with respect to the surface of the nitride semiconductor layer 10. The trench 40 has a forward tapered shape.

The inclination angles of the first side face 40a and the second side face 40b with respect to the bottom face 40c or the surface of the nitride semiconductor layer 10 are, for example, equal to or more than 30 degrees and equal to or less than 80 degrees. The taper angle of the trench 40 is, for example, equal to or more than 30 degrees and equal to or less than 80 degrees.

At least a part of the gate electrode 18 is formed in the trench 40. The gate electrode 18 is provided between the source electrode 20 and the drain electrode 22.

The gate electrode 18 is, for example, polycrystalline silicon containing conductive impurities. Further, the gate electrode 18 is, for example, metal. Further, the gate electrode 18 is, for example, titanium nitride (TiN).

At least a part of the gate insulating layer 16 is formed in the trench 40. The gate insulating layer 16 is disposed between the channel layer 14 and the gate electrode 18. The gate insulating layer 16 is disposed between the first side face 40a of the trench 40 and the gate electrode 18, between the second side face 40b of the trench 40 and the gate electrode 18, and the bottom face 40c of the trench 40 and the gate electrode 18.

The gate insulating layer 16 is also formed on the first interlayer insulating layer 31 between the gate electrode 18 and the drain electrode 22. The gate insulating layer 16 is also formed on the barrier layer 15 between the gate electrode 18 and the source electrode 20.

The gate insulating layer 16 is, for example, an oxide or an oxynitride. The gate insulating layer 16 is, for example, silicon oxide (SiO2), aluminum oxide (Al2O3), silicon oxynitride (SiON), aluminum oxynitride (AlON), or aluminum oxynitride silicate (SiAlON). A stacked structure of them (for example, SiAlON/SiO2) may be used.

The thickness of the gate insulating layer 16 is, for example, equal to or more than 20 nm and equal to or less than 100 nm. The equivalent silicon oxide film thickness (EOT: Equivalent Oxide Thickness) of the gate insulating layer 16 is, for example, equal to or more than 20 nm and equal to or less than 40 nm.

The bottom face 40c of the trench 40 is disposed in the channel layer 14. The gate insulating layer 16 and the gate electrode 18 are formed in the trench 40.

At least a part of the first aluminum nitride layer 61 is formed in the trench 40. The first aluminum nitride layer 61 is disposed between the first side face 40a of the trench 40 and the gate insulating layer 16, between the second side face 40b of the trench 40 and the gate insulating layer 16, and the bottom face 40c of the trench 40 and the gate insulating layer 16.

The bandgap of the first aluminum nitride layer 61 is wider than the bandgap of the channel layer 14 and the bandgap of the barrier layer 15. The film thickness of the first aluminum nitride layer 61 is, for example, equal to or more than 0.5 nm and equal to or less than 30 nm.

The first aluminum nitride layer 61 preferably has crystallinity inside the trench and has an amorphous structure on the first interlayer insulating layer 31. In order to generate a large amount of 2DEG, the film thickness of the first aluminum nitride layer 61 is preferably large. However, since the gate insulating layer 16 is in contact with the first aluminum nitride layer 61, when the thick aluminum nitride layer 61 is introduced, charge traps are generated at the interface. Therefore, the film thickness of the first aluminum nitride layer 61 is preferably equal to or more than 0.5 nm and equal to or less than 3 nm.

For example, an amorphous layer is provided between the first aluminum nitride layer 61 and the gate insulating layer 16. The material of the amorphous layer is different from the materials of the first aluminum nitride layer 61 and the gate insulating layer 16, for example. The chemical composition of the amorphous layer is different from the chemical composition of the first aluminum nitride layer 61 and the gate insulating layer 16, for example. An amorphous layer such as AlON, SiON, or SiAlON is reacted and produced at the interface where the first aluminum nitride layer 61 and the gate insulating layer 16 are in contact with each other, whereby charge traps can be suppressed. For example, first, an aluminum nitride (AlN) film having a thickness of about 5 nm is formed, a silicon oxide ($SiO_2$) film having a thickness of about 30 nm is formed on the AlN film, and annealing is performed. By this method, mutual diffusion of elements occurs at the interface, and a stacked structure of crystalline AlN (2 nm)/amorphous SiAlON (about 5 nm)/ amorphous $SiO_2$ (about 28 nm) is generated.

A heterojunction interface is formed between the first aluminum nitride layer 61 and the channel layer 14. A two-dimensional electron gas (2DEG) is formed at the heterojunction interface and becomes a carrier of the HEMT 200.

A heterojunction interface is formed between the crystalline first aluminum nitride layer 61 in contact with the first side face 40a of the trench 40 and the channel layer 14. A C-axis component by the inclined trench remains at the heterojunction interface. Therefore, a two-dimensional electron gas (2DEG) is formed at the heterojunction interface and becomes a carrier of the HEMT 200.

A heterojunction interface is formed similarly between the crystalline first aluminum nitride layer 61 in contact with the second side face 40b of the trench 40 and the channel layer 14. A C-axis component by the inclined trench remains at the heterojunction interface. Therefore, a two-dimensional electron gas (2DEG) is formed at the heterojunction interface and becomes a carrier of the HEMT 200.

That is, the 2DEG is formed on the bottom face 40c, the first side face 40a, and the second side face 40b of the trench 40. Therefore, compared to a case where the first aluminum nitride layer 61 is not provided, a high mobility interface is formed. Therefore, it is possible to reduce the resistance of the HEMT 200 and perform high speed operation.

The inclination angle of the trench 40 is a forward taper (greater than 0 degrees and less than 90 degree) in order to generate a 2DEG. The smaller the inclination angle of the trench 40, the more 2DEG can be generated. Therefore, the inclination angle of the trench 40 is preferably equal to or less than 80 degrees, and more preferably equal to or less than 50 degrees at which about half the component of the C-axis polarization remains.

In order to make use of the oblique components of the trench 40, it is preferable to engrave the trench 40 in the channel layer 14 at least 30 nm or more, more preferably 50 nm or more, and much more preferably 100 nm or more.

When the angle of the trench 40 decreases, the channel length of the inclined portion increases. Therefore, the inclination angle (forward taper angle) of the trench 40 is preferably equal to or more than 30 degrees, and more preferably equal to or more than 40 degrees. Typically, a 100 nm engraving into the channel layer 14 of the trench 40 and a 45-degree inclination angle of the trench are employed.

For example, by reversely tapering from 90 degrees without applying the forward taper, the 2DEG can be separated, and the threshold voltage can be increased. However, in this case, high mobility cannot be ensured, and the case is not suitable for high speed operation. In addition, an element which has a p-type MOS interface and performs an inversion operation is not suitable for high-speed operation.

In the HEMT 200 of the fifth embodiment, for example, by providing the trench 40 with a forward taper angle of about 45 degrees, a low on-resistance due to high mobility and high speed operation can be secured. In addition, for example, by using the local p-type impurity region forming method by ion implantation of the first to third embodiments, the potential of the channel layer 14 can be raised to increase the threshold voltage.

The impurity region 10x is disposed on the lateral side of the trench 40 in the channel layer 14. The impurity region 10x is disposed on the lateral side of the second side face 40b of the trench 40. The upper end of the impurity region 10x is shallower than the bottom face 40c of the trench 40.

The impurity region 10x contains at least one p-type impurity selected from the group consisting of beryllium (Be), magnesium (Mg), calcium (Ca), strontium (Sr), barium (Ba), zinc (Zn), and cadmium (Cd). The impurity region 10a is a p-type impurity region.

The p-type impurity concentration of the impurity region 10x is, for example, equal to or more than $1 \times 10^{16}$ cm$^{-3}$ and equal to or less than $1 \times 10^{19}$ cm$^{-3}$.

The impurity region 10x raises the potential of the channel layer 14 between the trench 40 and the impurity region 10x.

The impurity region 10x has a function of increasing the threshold voltage of the HEMT 200. Unlike the inverted MOS in which the channel portion is p-type, the HEMT 200 uses the 2DEG of the interface, and thus has high mobility and can operate at high speed.

The impurity region 10x is provided, for example, on the lateral side of at least one of the first side face 40a and the second side face 40b. The impurity region 10x may be disposed, for example, only on the lateral side of the first side face 40a. Further, the impurity regions 10x may be disposed, for example, on lateral sides of both the first side face 40a and the second side face 40b.

The second side face 40b side is a drain side to which a high voltage is applied, and the threshold voltage tends to be lower (Drain-induced barrier lowering, DIBL) compared to the first side face 40a side. DIBL can be suppressed by disposing the impurity region 10x on the second side face 40b side. Further, for example, by disposing the impurity region 10x on the first side face 40a side, the threshold voltage on the side where DIBL does not occur can be adjusted. Therefore, the threshold voltage can be efficiently improved. The HEMT 200 increases the threshold voltage by raising the potential felt by the 2DEG of the side face while maintaining the 2DEG on the bottom face 40c.

For example, the impurity region 10x and the second side face 40b are separated from each other. The distance between the impurity region 10x and the second side face 40b is, for example, equal to or more than 2 nm and equal to or less than 5 nm.

The impurity region 10x is not provided immediately below the bottom face 40c, for example.

As for the formation of the impurity region 10x, for example, a mask material is formed on the bottom face 40c after forming the trench 40 in the nitride semiconductor layer 10. Then, for example, a p-type impurity is introduced into the nitride semiconductor layer 10 from the second side face 40b of the trench 40 by using an oblique ion implantation method, thereby forming the impurity region 10x.

In the nitride semiconductor layer 10, for example, by using the oblique ion implantation method, magnesium is implanted by the first ion implantation, nitrogen is implanted by the second ion implantation, and further hydrogen is ion-implanted by the third ion implantation.

The impurity region 10b is provided in the nitride semiconductor layer 10 immediately below the source electrode 20 and immediately below the drain electrode 22. The impurity region 10b is provided in the channel layer 14, the second aluminum nitride layer 62, and the barrier layer 15. The source electrode 20 and the drain electrode 22 are in contact with the impurity region 10b.

The impurity region 10b contains at least one n-type impurity selected from the group consisting of silicon (Si), germanium (Ge), and tin (Sn). The impurity region 10b is an n-type impurity region.

The n-type impurity concentration of the impurity region 10b is, for example, equal to or more than $1 \times 10^{19}$ cm$^{-3}$ and equal to or less than $1 \times 10^{22}$ cm$^{-3}$.

The impurity region 10b contains activated high-concentration n-type impurities. Therefore, the impurity region 10b has a function of reducing the contact resistance of the source electrode 20 and the drain electrode 22 and realizing ohmic contact.

Similarly to the manufacturing method of semiconductor devices according to the fourth embodiment, the impurity region 10b is formed, for example, by implanting silicon by the first ion implantation, implanting nitrogen by the second ion implantation, and further ion-implanting hydrogen by the third ion implantation.

The first interlayer insulating layer 31 is provided between the nitride semiconductor layer 10 and the first aluminum nitride layer 61. For example, the first interlayer insulating layer 31 is silicon nitride.

The second interlayer insulating layer 32 is provided between the gate insulating layer 16, the gate electrode 18, the source electrode 20, and the drain electrode 22. For example, the second interlayer insulating layer 32 is silicon nitride.

The HEMT 200 of the fifth embodiment includes the first aluminum nitride layer 61 in contact with the channel layer 14 in the trench 40. Further, the trench 40 has a forward tapered shape. Therefore, a two-dimensional electron gas is formed between the first side face 40a, the second side face 40b, and the bottom face 40c of the trench 40 and the channel layer 14. A two-dimensional electron gas is formed at the interface between the first aluminum nitride layer 61 and the channel layer 14. Therefore, high mobility can be realized.

The concentration of the formed two-dimensional electron gas becomes smaller in the vicinity of the first side face 40a and the second side face 40b than in the bottom face 40c. In the HEMT 200 of the fifth embodiment, the impurity region 10x is formed on the lateral side of the second side face 40b in which the concentration of the two-dimensional electron gas is relatively low. Therefore, for example, compared to a case where the impurity region is provided below the bottom face 40c, it becomes easy to increase the threshold voltage of the HEMT 200.

From the viewpoint of realizing high mobility, the distance between the impurity region 10x and the first side face 40a, between the impurity region 10x and the second side face 40b, and between the impurity region 10x and the bottom face 40c is preferably equal to or more than 2 nm.

From the viewpoint of realizing a high threshold voltage, the distance between the impurity region 10x and the first side face 40a, between the impurity region 10x and the second side face 40b, and between the impurity region 10x and the bottom face 40c is preferably equal to or less than 5 nm.

When the impurity region 10x is formed, magnesium is injected by the first ion implantation, nitrogen is implanted by the second ion implantation, and hydrogen is further ion-implanted by the third ion implantation, whereby the low-resistance impurity region 10x can be formed locally.

The HEMT 200 of the fifth embodiment includes the second aluminum nitride layer 62 having a large bandgap between the channel layer 14 and the barrier layer 15. A two-dimensional electron gas is formed at the interface between the second aluminum nitride layer 62 and the channel layer 14. Therefore, high mobility can be realized.

The second aluminum nitride layer 62 has a large bandgap and thus has high resistance. The second aluminum nitride layer 62 contains at least one n-type impurity selected from the group consisting of silicon (Si), germanium (Ge), and tin (Sn) immediately below the source electrode 20 and immediately below the drain electrode 22. Therefore, the second aluminum nitride layer 62 has a low resistance immediately below the source electrode 20 and immediately below the drain electrode 22. Therefore, the resistance between the source electrode 20 and the channel layer 14 and the resistance between the drain electrode 22 and the channel layer 14 are reduced.

From the viewpoint of reducing the resistance between the source electrode 20 and the channel layer 14 and the resistance between the drain electrode 22 and the channel layer 14, preferably, the peak of the concentration distribution of the n-type impurity in the depth direction is positioned in the second aluminum nitride layer 62.

When the impurity region 10b is formed, magnesium is implanted by the first ion implantation, nitrogen is implanted by the second ion implantation, and hydrogen is further ion-implanted by the third ion implantation, whereby the low-resistance impurity region 10b can be formed locally.

The lateral diffusion of the n-type impurity in the impurity region 10b is suppressed, so that reduction in the breakdown voltage of the HEMT 200 due to the provision of the impurity region 10b is suppressed.

As described above, in the semiconductor device according to the fifth embodiment, a HEMT having high mobility and a high threshold voltage can be realized.

In the fourth and fifth embodiments, the HEMT is described as an example of the semiconductor device, but the present disclosure can be applied to a semiconductor device other than the HEMT. For example, the present disclosure can be applied to an optical semiconductor device such as an LED (Light Emitting Diode).

While certain embodiments have been described, these embodiments have been presented by way of example only, and are not intended to limit the scope of the inventions. Indeed, the manufacturing method of semiconductor devices and the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing semiconductor device, comprising:
    performing a first ion implantation implanting at least one element selected from a group consisting of beryllium (Be), magnesium (Mg), calcium (Ca), strontium (Sr), barium (Ba), zinc (Zn), cadmium (Cd), silicon (Si), germanium (Ge), and tin (Sn) into a nitride semiconductor layer;
    performing a second ion implantation implanting nitrogen (N) into the nitride semiconductor layer;
    performing a third ion implantation implanting hydrogen (H) into the nitride semiconductor layer;
    forming a covering layer on a surface of the nitride semiconductor layer after the performing the first ion implantation, the second ion implantation, and the third ion implantation;
    performing a first heat treatment after the forming the covering layer;
    removing the covering layer after the performing the first heat treatment; and
    performing a second heat treatment after the removing the covering layer.

2. The method according to claim 1, wherein the covering layer is an insulator.

3. The method according to claim 2, wherein the covering layer includes silicon oxide, silicon nitride, silicon oxynitride, or aluminum nitride.

4. The method according to claim 1, wherein the first heat treatment is performed in an atmosphere containing argon, nitrogen, hydrogen, or helium.

5. The method according to claim 4, wherein the first heat treatment is performed in an atmosphere containing hydrogen.

6. The method according to claim 1, wherein the second heat treatment is performed in an atmosphere containing argon, nitrogen, or helium.

7. The method according to claim 1, wherein the second heat treatment is performed at a pressure lower than a pressure of the first heat treatment.

8. The method according to claim 1, wherein a dose amount of nitrogen in the second ion implantation is larger than a dose amount of the at least one element in the first ion implantation.

9. The method according to claim 1, wherein a concentration of nitrogen at any position in the depth direction of the nitride semiconductor layer is higher than a concentration of the at least one element after the second ion implantation.

10. The method according to claim 1, wherein a dose amount of hydrogen in the third ion implantation is larger than a dose amount of the at least one element of the first ion implantation and is larger than a dose amount of nitrogen in the second ion implantation.

11. The method according to claim 1, wherein a concentration distribution of hydrogen formed in the nitride semiconductor layer by the third ion implantation covers a concentration distribution of the at least one element formed in the nitride semiconductor layer by the first ion implantation.

12. The method according to claim 1, wherein a dose amount of the at least one element in the first ion implantation is equal to or more than $1 \times 10^{11}$ cm$^{-2}$ and equal to or less than $1 \times 10^{15}$ cm$^{-2}$.

13. The method according to claim 1, wherein a dose amount of hydrogen in the third ion implantation is equal to or more than $1 \times 10^{15}$ cm$^{-2}$.

14. The method according to claim 1, further comprising:
forming a trench in the nitride semiconductor layer before the performing the first ion implantation, the second ion implantation, and the third ion implantation;
forming a gate insulating layer in the trench after the performing the second heat treatment; and
forming a gate electrode in the trench after the forming the gate insulating layer, wherein
the at least one element is implanted to a bottom face of the trench by the first ion implantation, nitrogen (N) is implanted to the bottom face of the trench by the second ion implantation, and hydrogen (H) is implanted to the bottom face of the trench by the third ion implantation.

15. The method according to claim 1, further comprising:
forming a metal layer on the surface of the nitride semiconductor layer after the performing the second heat treatment.

16. A method of manufacturing semiconductor device, comprising:
performing a first ion implantation implanting at least one element selected from a group consisting of beryllium (Be), magnesium (Mg), calcium (Ca), strontium (Sr), barium (Ba), zinc (Zn), cadmium (Cd), silicon (Si), germanium (Ge), and tin (Sn) into a nitride semiconductor layer;
performing a second ion implantation implanting nitrogen (N) into the nitride semiconductor layer;
performing a third ion implantation implanting hydrogen (H) into the nitride semiconductor layer;
forming a covering layer on a surface of the nitride semiconductor layer after the performing the first ion implantation, the second ion implantation, and the third ion implantation;
performing a first heat treatment after forming the covering layer; and
performing a second heat treatment under a condition different from a condition of the first heat treatment after the first heat treatment.

17. The method according to claim 16, wherein the first heat treatment is performed in an atmosphere containing hydrogen, and the second heat treatment is performed in an atmosphere containing no hydrogen or in an atmosphere having a hydrogen partial pressure lower than a hydrogen partial pressure of the first heat treatment.

18. The method according to claim 16, wherein the second heat treatment is performed at a pressure lower than a pressure of the first heat treatment.

19. A semiconductor device comprising:
a first nitride semiconductor layer;
a second nitride semiconductor layer disposed on the first nitride semiconductor layer, the second nitride semiconductor layer having a bandgap wider than a bandgap of the first nitride semiconductor layer;
a first electrode disposed on the second nitride semiconductor layer, the first electrode being electrically connected to the second nitride semiconductor layer;
a second electrode disposed on the second nitride semiconductor layer, the second electrode being electrically connected to the second nitride semiconductor layer;
a trench disposed between the first electrode and the second electrode, the trench having a first side face, a second side face, and a bottom face between the first side face and the second side face, and the bottom face disposed in the first nitride semiconductor layer;
a gate electrode disposed in the trench;
a gate insulating layer disposed between the bottom face and the gate electrode, between the first side face and the gate electrode, and between the second side face and the gate electrode; and
a third nitride semiconductor layer disposed between the bottom face and the gate insulating layer, between the first side face and the gate insulating layer, and between the second side face and the gate insulating layer, the third nitride semiconductor layer having a bandgap wider than the bandgaps of the first nitride semiconductor layer and the second nitride semiconductor layer, wherein
the first nitride semiconductor layer includes, on a lateral side of at least one of the first side face and the second side face, a first region containing at least one element selected from a group consisting of beryllium (Be), magnesium (Mg), calcium (Ca), strontium (Sr), barium (Ba), zinc (Zn), and cadmium (Cd).

20. The semiconductor device according to claim 19, further comprising:
a fourth nitride semiconductor layer provided between the first nitride semiconductor layer and the second nitride semiconductor layer, the fourth nitride semiconductor layer having a bandgap wider than the bandgaps of the first nitride semiconductor layer and the second nitride semiconductor layer, and the fourth nitride semiconductor layer including a second region containing at least one element selected from a group consisting of silicon (Si), germanium (Ge), and tin (Sn).

* * * * *